United States Patent [19]
Yamauchi

[11] Patent Number: 5,852,380
[45] Date of Patent: Dec. 22, 1998

[54] PHASE ADJUSTING CIRCUIT, SYSTEM INCLUDING THE SAME AND PHASE ADJUSTING METHOD

[75] Inventor: Hiroyuki Yamauchi, Takatsuki, Japan

[73] Assignee: Matsushita Electric Industrial Co., Ltd., Kadoma, Japan

[21] Appl. No.: 731,437

[22] Filed: Oct. 15, 1996

[30] Foreign Application Priority Data

Oct. 20, 1995 [JP] Japan ................... 7-273204

[51] Int. Cl.⁶ ................ H03K 5/13; H03K 5/26
[52] U.S. Cl. .............. 327/243; 327/158; 327/292; 327/284
[58] Field of Search ................. 327/146, 149, 327/152, 153, 155, 156, 158, 161, 233–236, 237, 241, 243–245, 269, 270, 271, 276–278, 284, 299, 292; 375/356

[56] References Cited

U.S. PATENT DOCUMENTS

| | | |
|---|---|---|
| 5,101,117 | 3/1992 | Johnson et al. ............... 327/149 |
| 5,307,381 | 4/1994 | Ahuja ......................... 327/156 |
| 5,355,037 | 10/1994 | Andresen et al. .............. 327/158 |
| 5,420,544 | 5/1995 | Ishibashi ..................... 327/156 |
| 5,552,733 | 9/1996 | Lesmeister .................... 327/156 |
| 5,572,557 | 11/1996 | Aoki .......................... 327/161 |
| 5,578,945 | 11/1996 | Flora ......................... 327/156 |
| 5,646,564 | 7/1997 | Erickson et al. ............... 327/161 |
| 5,663,687 | 9/1997 | Kozu .......................... 327/161 |
| 5,670,903 | 9/1997 | Mizuno ........................ 327/158 |
| 5,684,421 | 11/1997 | Chapman et al. ................ 327/158 |

OTHER PUBLICATIONS

Richard B. Watson, Jr. et al, IEEE 1992 Custom Integrated Circuits Conference, "Clock Buffer Chip with Absolute Delay Regulation Over Process and Environmental Variations" pp. 25.2.1–25.2.5.

Primary Examiner—Timothy P. Callahan
Assistant Examiner—Eunja Shin
Attorney, Agent, or Firm—Renner, Otto, Boisselle & Sklar, P.L.L.

[57] ABSTRACT

A phase adjusting circuit includes a circuit for providing an internal clock signal in synchronization with a reference clock signal, a delay circuit for delaying the internal clock signal for a predetermined delay time and an adjusting section for adjusting a phase difference between a phase of the reference clock signal and a phase of the internal clock signal delayed for the predetermined delay time.

18 Claims, 22 Drawing Sheets

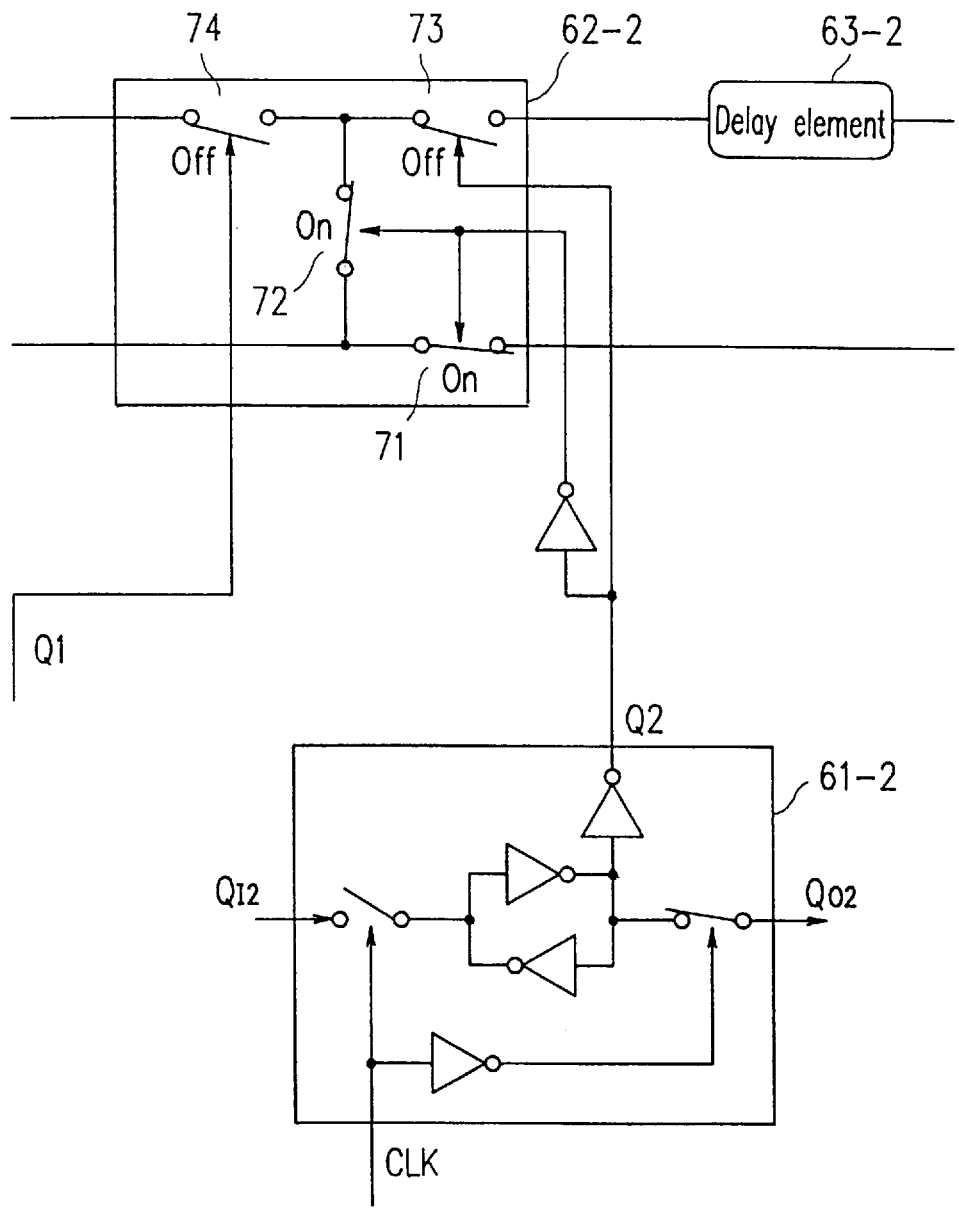

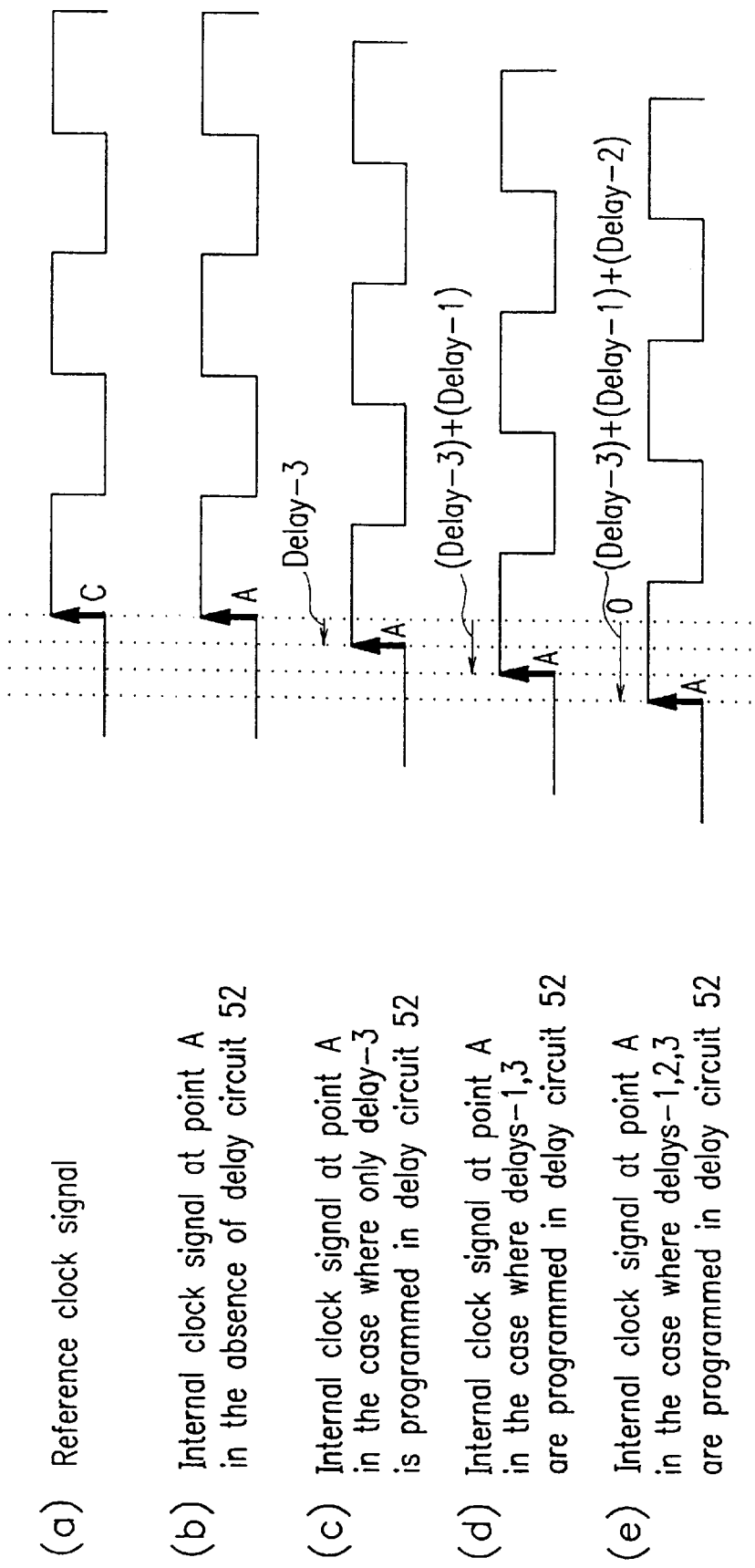

FIG.10

(a) Reference clock signal (b) Internal clock signal at point A in the absence of delay circuit 52

(c) Internal clock signal at point A in the case where only delay-3 is programmed in delay circuit 52

(d) Internal clock signal at point A in the case where delays-1,3 are programmed in delay circuit 52

(e) Internal clock signal at point A in the case where delays-1,2,3 are programmed in delay circuit 52

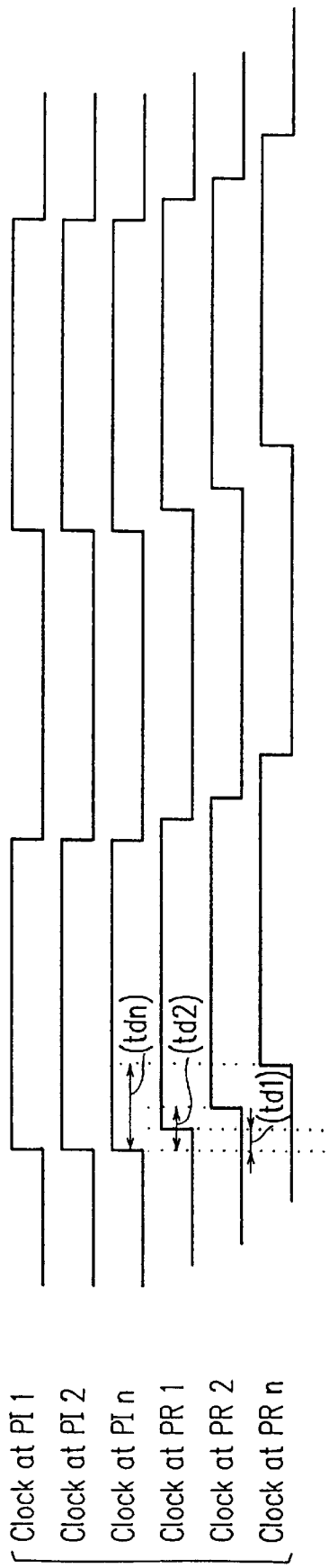
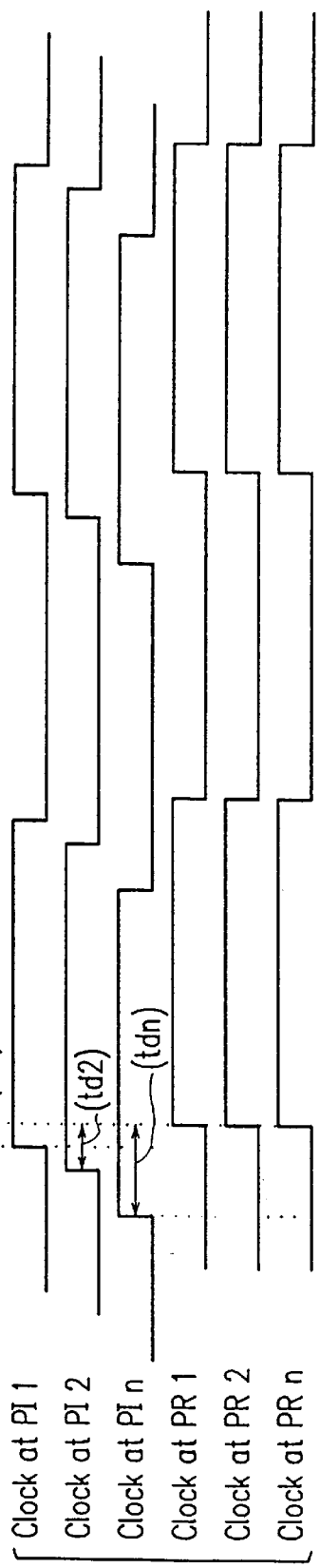
FIG. 17

PHASE ADJUSTING CIRCUIT, SYSTEM INCLUDING THE SAME AND PHASE ADJUSTING METHOD

BACKGROUND OF THE INVENTION

1. Field of the Invention

The present invention relates to a phase adjusting circuit for adjusting a phase of a clock signal and a system including the phase adjusting circuit, which operates in synchronization with the clock signal. The present invention also relates to a phase adjusting method.

2. Description of the Related Art

It has become commonplace to control the timing of operation of a circuit via synchronization with a clock signal. The clock signal is transmitted to a circuit which operates in synchronization with the clock signal via lines. Often, however, the phase of the clock signal is shifted due to wiring delay. For the purpose of compensating for the shift of the phase of the clock signal due to the wiring delay, a variety of techniques have been developed.

A paper titled "Clock Buffer Chip with Absolute Delay Regulation Over Process and Environmental Variations" by Richard B. Watson, Jr. et al., IEEE 1992 CUSTOM INTEGRATED CIRCUITS CONFERENCE, pages 25.2.1–25.2.5, 1992 discloses a technique for compensating for the shift of the phase of the clock signal due to the wiring delay. In this prior art article, the phase of the clock signal, shifted by the wiring delay (inevitable wiring delay) generated depending on a distance for which the clock signal is transmitted, is further shifted by an additional delay. Thus, the shifted phase of the clock signal is matched with a phase of a clock signal including a reference edge on the rising edge two clock cycles away from the reference edge.

FIG. 19 is a timing chart showing the relationship between the adjustment of the phase of the clock signal and data latency by this technique. In a waveform (a) in FIG. 19, the reference edge is indicated by an arrow A. The reference edge A in the waveform (a) is shifted to the position indicated by an arrow A' in a waveform (b) in FIG. 19 by an inevitable wiring delay, and further shifted to the position indicated by an arrow A" by an additional delay. Thus, the edge A" in the waveform (c) is delayed for two clock cycles from the reference edge of the clock signal shown in the waveform (a), and the phase of the clock signal shown in the waveform (c) is matched with the phase of the clock signal shown in the waveform (a).

Accordingly, if it is predetermined that data corresponding to the reference edge A of the clock signal shown in the waveform (a) is taken in at the time two clock cycles later than the time when the reference edge A rises, an operation of receiving erroneous data due to the shifted phase of the clock signal is prevented.

A term, "latency" refers to a time period from the rise of the reference edge of the clock signal to the edge at which data corresponding to the reference edge is actually input or output. In the example of a waveform (c) in FIG. 19, latency is indicated by a time period T, which corresponds to two clock cycles.

However, the prior art of Richard et al. has the following problems.

Firstly, the prior art of Richard et al. is used for adjusting a phase of a clock signal when wiring delay amounts between two points are known. Accordingly, in the case where a wiring delay amount (e.g., a wiring length causing the wiring delay) after implementation of an LSI is known at the time of designing the LSI, the phase of the clock can be adjusted by applying the prior art of Richard et al. Such adjustment of the phase of the clock is achieved, for example, by providing dummy delay elements or dummy lines corresponding to the wiring delay amount. However, in the case where the wiring delay amount after the implementation of the LSI cannot be predicted at the time of designing the LSI, the prior art of Richard et al. cannot be applied. In the prior art of Richard et al., the adjustment of the phase of the clock after the implementation of the LSI is not considered.

According to the prior art of Richard et al., a driver transistor for driving external lines of the LSI is required to have a large size, in order to minimize driving delay in the external lines of the LSI as much as possible. When the driver transistor has a large size, the transistor section for operating the driver transistor consumes a large amount of power. Such an increase in power consumption is especially significant in a system including two or more LSIs (e.g., a system including a master LSI and a slave LSI). When a plurality of the above-mentioned transistor sections are present in the system, they consume substantially more power. In this manner, according to the prior art of Richard et al., the entire system adversely consumes a large amount of power.

Secondly, according to the prior art of Richard et al., data cannot be input or output until a period of two clock cycles has passed since the reference edge of the clock signal. For this reason, it is difficult to apply this technique to a synchronous circuit requiring a rapid input and output operation for data. For example, a serious problem arises in the case where data is input or output between a microprocessor and a memory, which requires frequent and rapid random access. In this case, since an access to a leading address in a read operation or a write operation is delayed for two clocks cycles, the problem of latency is more serious than an access time of the memory.

Furthermore, according to the prior art of Richard et al., the amount of additional delay required for shifting the shifted phase of the clock signal by exactly two clock cycles with respect to the reference edge depends on the frequency of the clock signal. As a result, in the case where the frequency of the clock signal is changed, even when there is no variation in the amount of the inevitable wiring delay, the amount of additional delay is forced to be changed. This results in reducing the flexibility for adjusting the phase of the clock signal.

Furthermore, according to the prior art of Richard et al., the amount of additional delay is expressed by the length of a bit string of 1 or 0. When the frequency of the clock signal is increased, it is necessary that the amount of additional delay be expressed by a string having a smaller number of bits, thus resulting in deterioration in the precision of the amount of additional delay. When the frequency of the clock signal is decreased, it is necessary that the amount of additional delay be expressed by a string having a larger number of bits, leading to a possibility of overflow.

SUMMARY OF THE INVENTION

A phase adjusting circuit of this invention includes: a circuit for providing an internal clock signal in synchronization with a reference clock signal; a delay circuit for delaying the internal clock signal for a predetermined delay time; and an adjusting section for adjusting a phase difference between a phase of the reference clock signal and a phase of the internal clock signal delayed for the predetermined delay time.

In one embodiment of the invention, the adjusting section adjusts the phase difference so that the phase of the internal clock signal is ahead of the phase of the reference clock signal for the predetermined delay time.

In another embodiment of the invention, the phase adjusting circuit further includes a delay control circuit for programmably changing the predetermined delay time in accordance with delay control information.

In still another embodiment of the invention, the delay control information includes precision information for defining precision of the predetermined delay time.

According to another aspect of the invention, a system includes a first circuit for generating a reference clock signal and delay control information and a second circuit for operating in synchronization with the reference clock signal. The second circuit includes: a circuit for providing an internal clock signal in synchronization with the reference clock signal; a delay circuit for delaying the internal clock signal for a predetermined delay time; an adjusting section for adjusting a phase difference between a phase of the reference clock signal and a phase of the internal clock signal delayed for the predetermined delay time; and a delay control circuit for programmably changing the predetermined delay time in accordance with the delay control information.

In one embodiment of the invention, the delay control information includes precision information for defining precision of the predetermined delay time.

In another embodiment of the invention, the delay control information is supplied from the outside of the system to the first circuit.

In still another embodiment of the invention, the delay control circuit includes a storage circuit for storing the delay control information. The delay circuit includes a plurality of delay elements and a plurality of switching elements for controlling the number of delay elements to be serially connected among the plurality of delay elements. Each of the plurality of switching elements is turned on or off in accordance with an output from the storage circuit.

In yet another embodiment of the invention, the delay control information is a digital signal of a predetermined number of bits. The digital signal is time-sequentially supplied from the first circuit to the second circuit via a delay control line.

In another embodiment of the invention, the predetermined delay time is determined based on at least one of a first delay time generated by a line extending from the first circuit to the second circuit, a second delay time generated by a line extending from the second circuit to the first circuit and a third delay time generated by a line inside the second circuit.

In still another embodiment of the invention, the second circuit includes a plurality of blocks for operating in synchronization with the internal clock signal, the internal clock signal being distributed to each of the plurality of blocks via a delay element, the third delay time being a delay time corresponding to the most delayed internal clock signal among the internal clock signals distributed to the plurality of blocks.

In yet another embodiment of the invention, the second circuit receives data from the first circuit, a phase of an input synchronous signal for defining timing at which the second circuit receives data from the first circuit being ahead of the phase of the reference clock signal.

In another embodiment of the invention, the second circuit receives first data from the first circuit, and the second circuit outputs second data to the first circuit. A phase of an input synchronous signal for defining timing at which the second circuit receives the first data from the first circuit, and a phase of an output synchronous signal for defining timing at which the second circuit outputs the second data to the first circuit are independently controlled.

In still another embodiment of the invention, the system includes a plurality of second circuits for operating in synchronization with the reference clock signal. The delay control information is a digital signal of a predetermined number of bits. The digital signal is time-sequentially supplied from the first circuit to each of the plurality of second circuits via a delay control line common to the plurality of second circuits.

In another embodiment of the invention, the system includes a plurality of second circuits for operating in synchronization with the reference clock signal. The first circuit supplies a control signal to each of the plurality of second circuits. The control signal has a phase which is ahead of the phase of the reference clock signal for a delay time corresponding to delay generated by a line between the first circuit and each of the plurality of second circuits.

According to another aspect of the invention, a phase adjusting method comprises the steps of: (a) determining a delay amount generated after a first circuit for generating a reference clock signal and a second circuit for operating in synchronization with the reference clock signal are implemented; and (b) adjusting a phase difference between a phase of the reference clock signal and a phase of an internal clock signal employed inside the second circuit based on the delay amount.

In another embodiment of the invention, the step (b) comprises the step of adjusting the phase difference so that a phase of the internal clock signal is ahead of a phase of the reference clock signal for a delay time corresponding to the delay amount.

In still another embodiment of the invention, the phase adjusting method further includes the step of changing the delay amount in accordance with delay control information.

In yet another embodiment of the invention, the delay control information includes precision information for defining the precision of the delay amount.

In another embodiment of the invention, the delay amount is determined based on at least one of a first delay time generated by a line extending from the first circuit to the second circuit and a second delay time generated by a line extending from the second circuit to the first circuit.

In still another embodiment of the invention, the second circuit receives data from the first circuit. The phase adjusting method further includes the step of adjusting a phase of the input synchronous signal for defining timing at which the second circuit receives the data from the first circuit so that the phase of the input synchronous signal is ahead of the phase of the reference clock signal.

In another embodiment of the invention, the second circuit receives first data from the first circuit, and the second circuit outputs second data to the first circuit. The phase adjusting method further includes the step of independently controlling a phase of an input synchronous signal for defining timing at which the second circuit receives the data from the first circuit, and a phase of an output synchronous signal for defining timing at which the second circuit outputs the data to the first circuit.

In still another embodiment of the invention, a plurality of second circuits for operating in synchronization with the reference clock signal are implemented. The first circuit supplies a control signal to each of the plurality of second circuits. The phase adjusting method further includes the step of adjusting a phase of the control signal so as to be ahead of the phase of the reference clock signal for a delay time corresponding to delay generated by a line between the first circuit and each of the plurality of second circuits.

Thus, the invention described herein makes possible the advantages of (1) providing a phase adjusting circuit and a phase adjusting method capable of adjusting a phase of a clock in accordance with a wiring delay amount generated after implementation of an LSI; (2) providing a phase adjusting circuit and a phase adjusting method capable of adjusting a phase of a clock so that latency is substantially eliminated; and (3) providing a system capable of realizing low power consumption.

These and other advantages of the present invention will become apparent to those skilled in the art upon reading and understanding the following detailed description with reference to the accompanying figures.

BRIEF DESCRIPTION OF THE DRAWINGS

FIG. 7 is a schematic diagram showing a detailed structure of a latch circuit and a switching element.

FIG. 10 is a timing diagram showing the relationship between a predetermined delay time (delay amount) to be set in the delay circuit and a waveform of an internal clock signal in a point A.

FIG. 17 is a timing diagram showing waveforms of control signals supplied from a control circuit in comparison with those of conventional control signals.

DESCRIPTION OF THE PREFERRED EMBODIMENTS

Hereinafter, the present invention will be described by way of examples with reference to the accompanying drawings.

Figure 1:
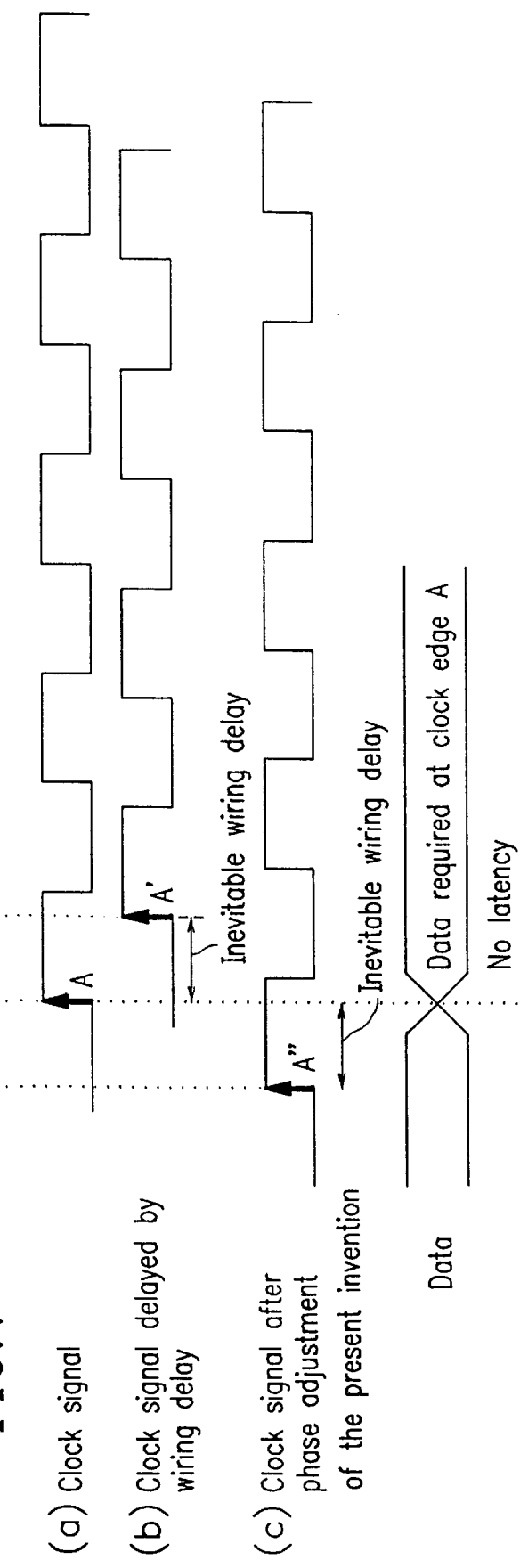
FIG. 1 is a timing diagram showing the relationship between adjustment of a phase of a clock signal and data latency.

FIG. 1 shows the relationship between adjustment of a phase of a clock signal and data latency according to the present invention. In a waveform (a) in FIG. 1, a reference edge of a clock signal is indicated by an arrow A. It is assumed that the reference edge A in the waveform (a) is shifted to the position indicated by an arrow A' in a waveform (b) by an inevitable wiring delay. The present invention is characterized by shifting a phase of a clock signal an amount equivalent to the inevitable wiring delay in the direction opposite to the direction to which the phase of the clock signal is shifted by the inevitable wiring delay. The thus phase adjusted clock signal is shown by a waveform (c) in FIG. 1.

As shown in the waveform (c) in FIG. 1, an edge A" corresponding to the reference edge A of the clock signal shown in the waveform (a) rises at a time earlier than the time when the reference edge A rises for a period corresponding to the inevitable wiring delay. Thus, if it is predetermined that data corresponding to the reference edge A of the clock signal shown in the waveform (a) is input and output at a time when the reference edge A rises, it is possible to input and output data without substantial latency.

EXAMPLE 1

Figure 2:
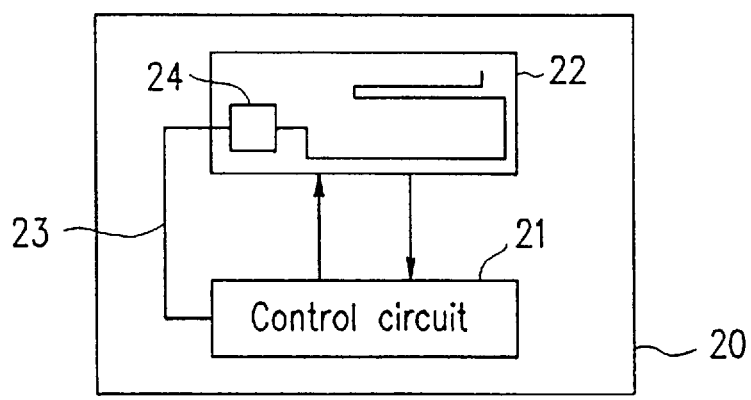
FIG. 2 is a schematic diagram showing a structure of a system of Example 1 according to the present invention.

FIG. 2 shows a structure of a system 20 of Example 1 according to the present invention. In the present invention, the "system" may be a group of LSIs independently packaged, a group of LSIs which are bare-chip implemented (multi-chip module), or a group of module blocks on the same semiconductor substrate.

The system 20 includes a control circuit 21 for generating a reference clock signal and a semiconductor integrated circuit 22 which operates in synchronization with the reference clock signal. For example, the control circuit 21 can be a processor, and the semiconductor integrated circuit 22 can be a memory. Alternatively, the control circuit 21 can be a master processor, and the semiconductor integrated circuit 22 can be a slave processor. The system 20 may be implemented on one chip.

The control circuit 21 and the semiconductor integrated circuit 22 are connected to each other via a line 23. The reference clock signal generated by the control circuit 21 is supplied to the semiconductor integrated circuit 22 via the line 23. The semiconductor integrated circuit 22 operates in synchronization with the reference clock signal supplied from the control circuit 21 via the line 23. The control circuit 21 and the semiconductor integrated circuit 22 input and output data in synchronization with the reference clock signal. The semiconductor integrated circuit 22 includes a phase adjusting circuit (PLL circuit) 24.

Figure 3:
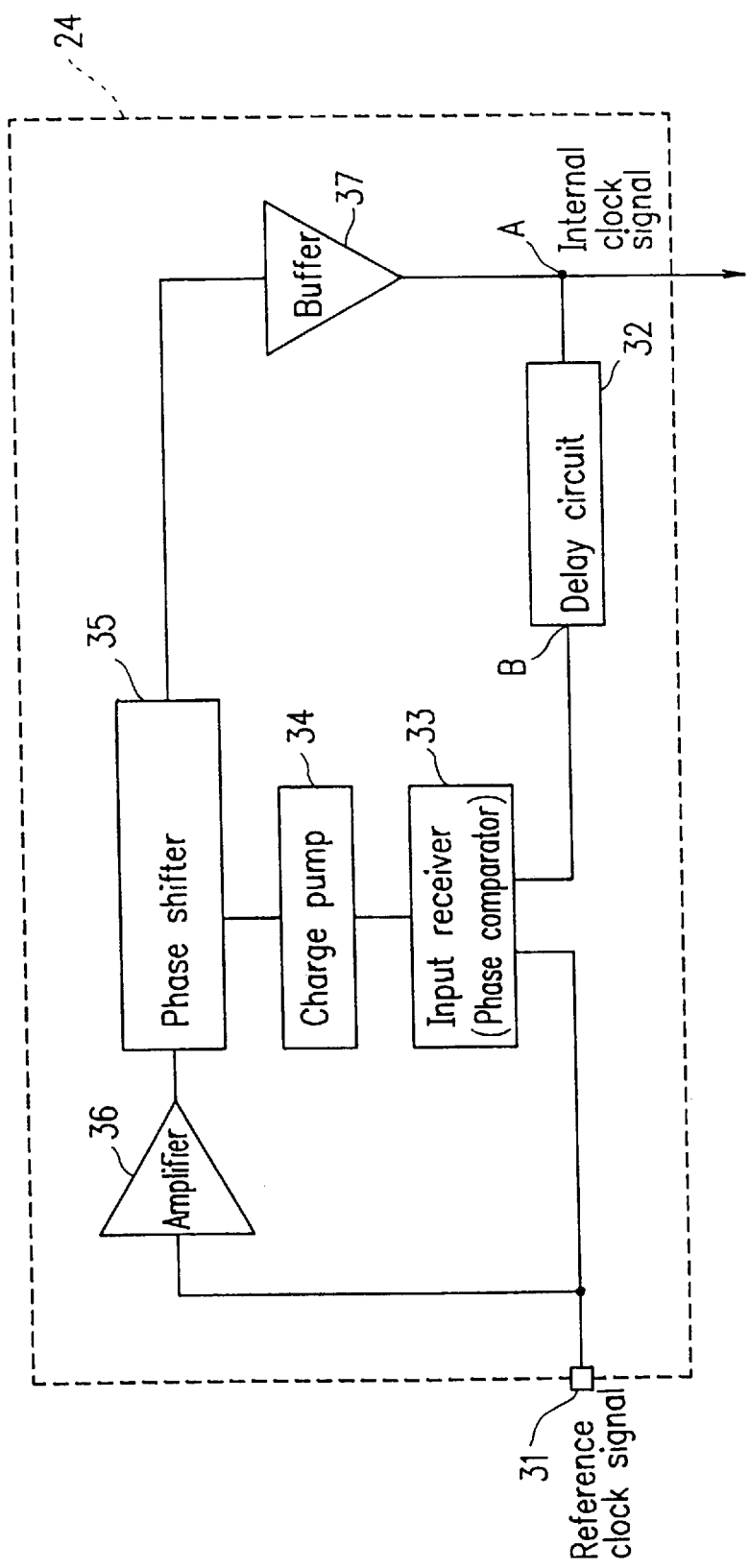
FIG. 3 is a schematic diagram showing a structure of a phase adjusting circuit.

FIG. 3 shows the structure of the phase adjusting circuit 24. The phase adjusting circuit 24 includes a terminal 31. The reference clock signal is input to the phase adjusting circuit 24 via the terminal 31. The phase adjusting circuit 24 outputs an internal clock signal. An edge of the internal clock signal corresponding to the reference edge of the reference clock signal rises or falls at a time earlier for a predetermined delay time than the time when the reference edge of the reference clock signal rises or falls. In the specification of the present invention, this is referred to as "the phase adjusting circuit 24 outputs an internal clock signal having a phase which is ahead of the phase of the reference clock signal for a predetermined delay time". The predetermined delay time is set by a delay circuit 32 included in the phase adjusting circuit 24. The delay circuit 32 is inserted between a point A connected to the internal clock signal and a point B connected to an input of an input receiver (hereinafter, referred to as a phase comparator) 33. The delay circuit 32 transmits a signal from the point A to the point B with delay for a predetermined delay time.

The phase adjusting circuit 24 includes the phase comparator 33, a charge pump 34 and a phase shifter 35. The phase comparator 33 detects a difference between a phase of a reference clock signal input from the terminal 31 and an internal clock signal delayed by the delay circuit 32 for a predetermined time so as to supply a signal indicating the phase difference to the charge pump 34. The charge pump 34 raises or lowers a voltage in accordance with the signal indicating the phase difference. In the case where the phase of the internal clock signal delayed by the delay circuit 32 for the predetermined delay time is behind the phase of the reference clock signal, the charge pump 34 raises the voltage. In the case where the phase of the internal clock signal delayed by the delay circuit 32 for the predetermined delay time is ahead of the phase of the reference clock signal, the charge pump 34 lowers the voltage. The phase shifter 35 shifts the phase of the reference clock signal input via an amplifier 36 so that there is substantially no difference between the phase of the reference clock signal and the phase of the internal clock signal delayed by the delay circuit 32 for the predetermined delay time. An output from the phase shifter 35 is output as an internal clock signal via a buffer 37.

Thus, by the phase adjusting circuit 24, a difference between the phase of the reference clock signal and the phase of the internal clock signal delayed by the delay circuit 32 for the predetermined delay time is maintained substantially zero. This means that the phase of the internal clock signal output from the phase adjusting circuit 24 is constantly ahead of the phase of the reference clock signal input to the phase adjusting circuit 24 for a predetermined delay time.

The delay circuit 32 can be any circuit, provided that it has the function of transmitting a signal from the point A in FIG. 3 to the point B with delay for a predetermined delay time. For example, as the delay circuit 32, an actual line having a predetermined length can be used.

EXAMPLE 2

Figure 4:
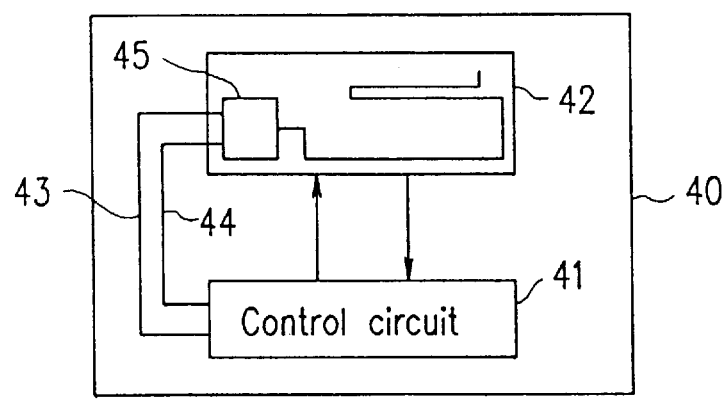
FIG. 4 is a schematic diagram showing a structure of a system of Example 2 according to the present invention.

FIG. 4 shows a system 40 of Example 2 according to the present invention. The system 40 includes a control circuit 41 and a semiconductor integrated circuit 42. For example, the control circuit 41 can be a processor, and the semiconductor integrated circuit 42 can be a memory. Alternatively, the control circuit 41 can be a master processor, and the semiconductor integrated circuit 42 can be a slave processor. The system 40 can be implemented on one chip.

The control circuit 41 and the semiconductor integrated circuit 42 are connected to each other via a line 43 and a delay control line 44. The control circuit 41 generates a reference clock signal and a delay control input. The reference clock signal generated by the control circuit 41 is supplied to the semiconductor integrated circuit 42 via the line 43. The delay control input generated by the control circuit 41 is supplied to the semiconductor integrated circuit 42 via the delay control line 44. The semiconductor integrated circuit 42 operates in synchronization with the reference clock signal supplied from the control circuit 41 via the line 43. The control circuit 41 and the semiconductor integrated circuit 42 input and output data in synchronization with the reference clock signal. The delay control input is employed so that a predetermined delay time can be programmably variable. The semiconductor integrated circuit 42 includes a phase adjusting circuit (PLL circuit) 45.

Figure 5:
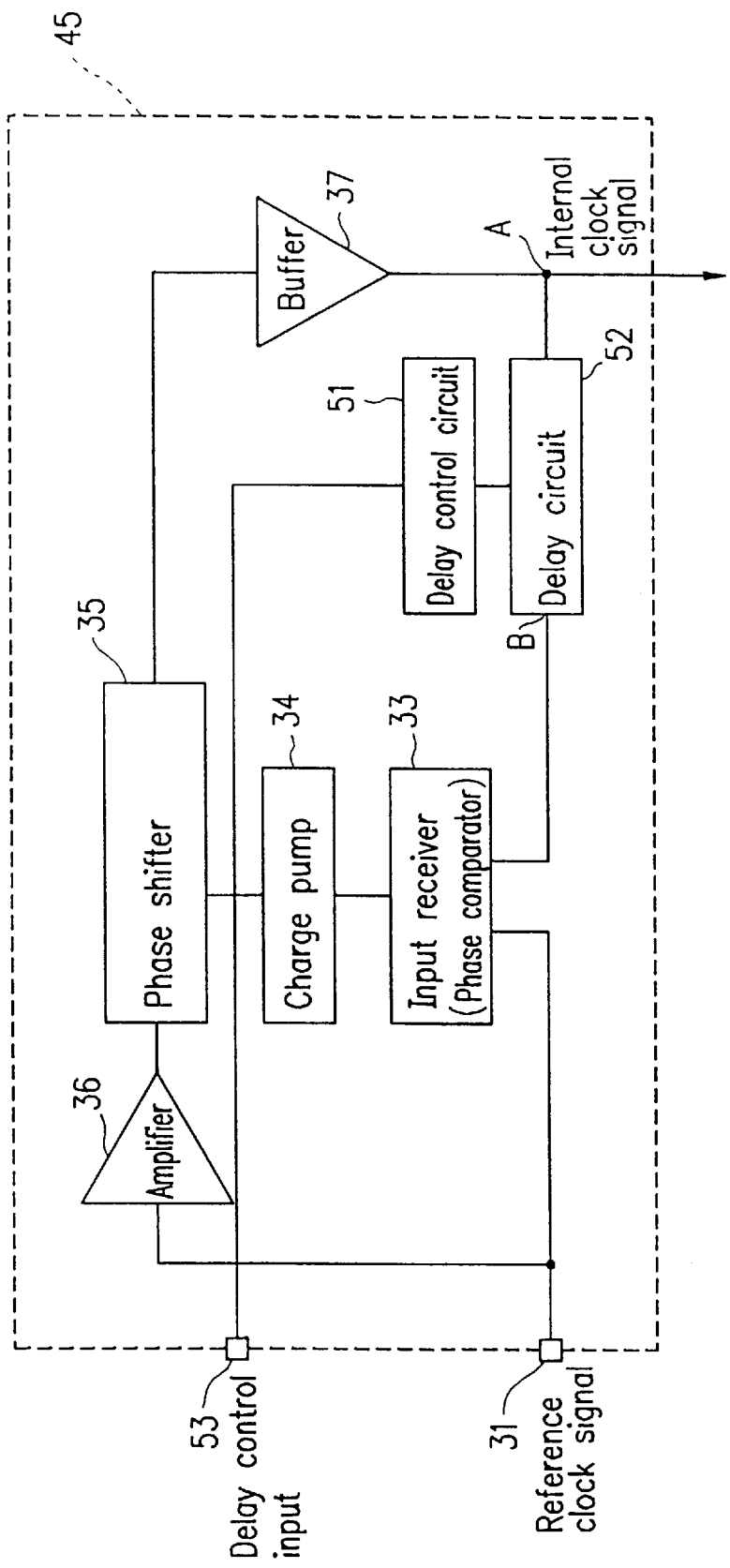
FIG. 5 is a schematic diagram showing a structure of a phase adjusting circuit.

FIG. 5 shows the structure of the phase adjusting circuit 45.

The phase adjusting circuit 45 is constructed by adding a delay control circuit 51 to the structure of the phase adjusting circuit 24 shown in FIG. 3 and replacing the delay circuit 32 shown in FIG. 3 by a programmably variable delay circuit 52. The phase adjusting circuit 45 includes a terminal 53. A delay control input is input to the phase adjusting circuit 45 via the terminal 53. The delay control circuit 51 receives the delay control input which is input from the terminal 53 and determines a predetermined delay time (delay amount) to be set in the delay circuit 52 in accordance with the delay control input. In the phase adjusting circuit 45, the same components as those of the phase adjusting circuit 24 shown in FIG. 3 bear the same reference numerals.

Figure 6A:
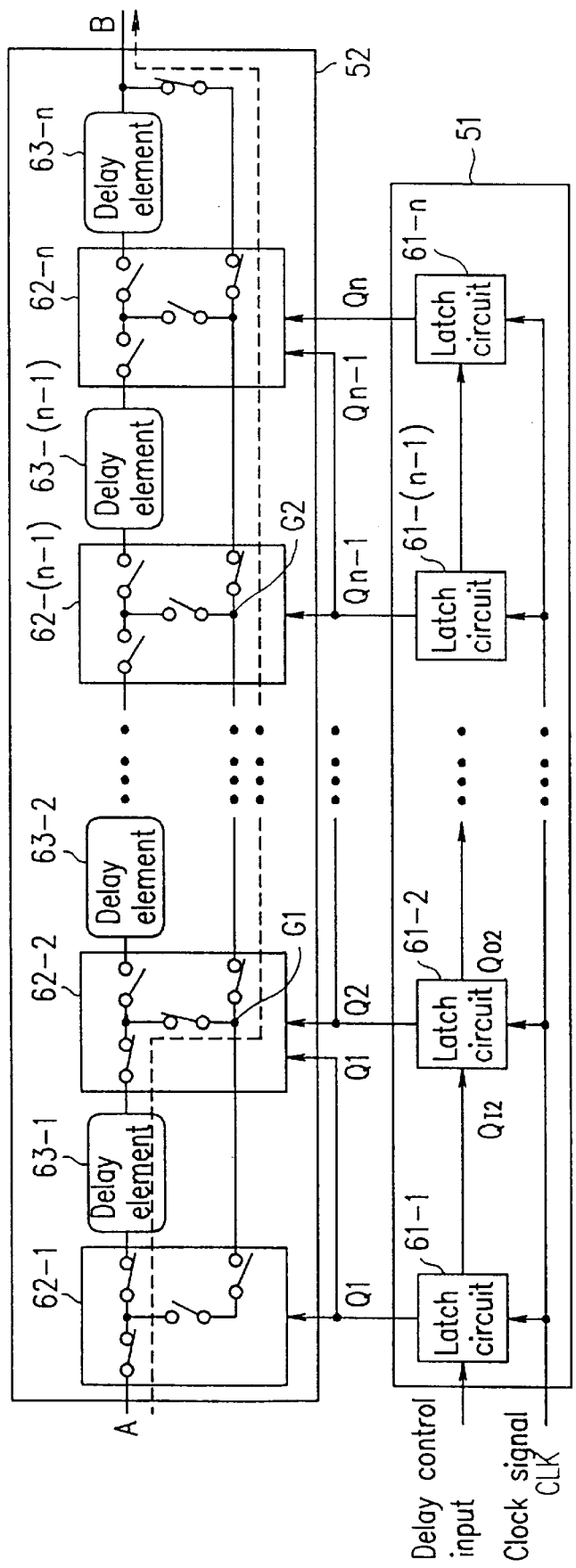
FIG. 6A is a schematic diagram showing a structure of a delay control circuit and a delay circuit.
Figure 6B:
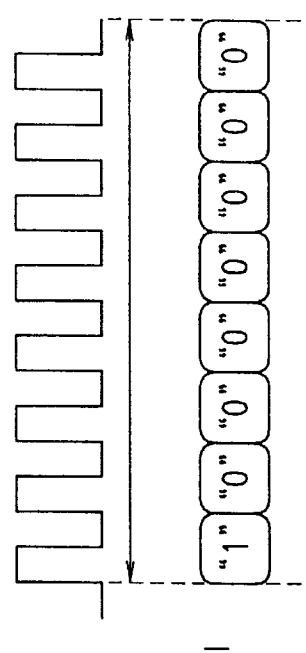
FIG. 6B is a timing diagram showing exemplary digital data supplied to the delay control circuit.

FIG. 6A shows the structure of the delay control circuit 51 and the delay circuit 52. The delay control circuit 51 includes a plurality of latch circuits 61-1 to 61-n. The latch circuits 61-1 to 61-n constitute a shift register. Digital data, time-sequentially transmitted from the control circuit 41 via the delay control line 44, is input as a delay control input to the delay control circuit 51. A value (0 or 1) of each bit of the digital data is stored in each of the latch circuits 61-1 to 61-n included in the delay control circuit 51. For example, as shown in FIG. 6B, in the case where the digital data has 8 bits, 8 latch circuits are included in the delay control circuit 51. Namely, n is 8. Generally, in the case where the digital data has n bits, n latch circuits are necessarily included in the delay control circuit 51. Herein, n is a positive integer.

The delay circuit 52 includes a plurality of switching elements 62-1 to 62-n and a plurality of delay elements 63-1 to 63-n. Each of the switching elements 62-1 to 62-n is connected to a corresponding latch circuit among the latch circuits 61-1 to 61-n. Whether the switching elements 62-1 to 62-n are ON or OFF is controlled in accordance with a value of the bit stored in the corresponding latch circuit. Thus, the switching elements 62-1 to 62-n are controlled by signals Q1 to Qn output from the latch circuits so as to be ON or OFF. By controlling the switching elements 62-1 to 62-n so as to be ON or OFF, the number of delay elements to be serially connected among the delay elements 63-1 to 63-n is controlled. By controlling the number of delay elements to be serially connected among the delay elements 63-1 to 63-n, a delay amount of a signal can be controlled.

For example, as shown in FIG. 6B, in the case where digital data which is input as a delay control input to the delay control circuit 51 is "10000000", the switching elements 62-1 to 62-n are controlled so that a signal input from the point A passes through only the delay element 63-1 without passing through the other delay elements 63-2 to 63-n so as to reach the point B (a signal path in this case is indicated by a dotted line in the FIG. 6A). In the case where digital data which is input as a delay control input to the delay control circuit 51 is "11000000", the switching elements 62-1 to 62-n are controlled, so that a signal input from the point A passes through only the delay elements 63-1 and 63-2 without passing through the other delay elements 63-3 to 63-n so as to reach the point B.

The delay amounts in the delay elements 63-1 to 63-n may be uniform, or they may not be uniform. In order to obtain many kinds of delay amount with a small number of delay elements, the delay amounts in the delay elements 63-1 to 63-n are preferably weighted. For example, in the case where the delay amounts are weighted based on binary representation, $2^n-1$ kinds of delay amounts can be obtained by n delay elements.

FIG. 7 shows a structure of the latch circuit 61-2 and the switching element 62-2 in greater detail. The switching element 62-2 includes switches 71 to 74. Each of the switches 71 to 73 are controlled by an output Q2 from the latch circuit 61-2. In the case where the output Q2 is "0", the switches 71 and 72 are turned on and the switch 73 is turned off. In the case where the output Q2 is "1", the switches 71 and 72 are turned off and the switch 73 is turned on. In this manner, in the case where the output Q2 is "0", a signal bypasses the delay element 63-2. In the case where the output Q2 is "1", a signal passes through the delay element 63-2.

The switch 74 is controlled by an output Q1 from the latch circuit 61-1. In the case where the output Q1 is "0", the switch 74 is turned off. In the case where the output Q1 is "1", the switch 74 is turned on.

The detailed structure of the latch circuits 61-1, and 61-3 to 61-n is the same as that of the latch circuit 61-2 shown in FIG. 7. The detailed structure of the switching elements 62-1, and 62-3 to 62-n is also the same as that of the switching element 62-2 shown in FIG. 7.

As described above, digital data (e.g., "10000000") is input to the delay control circuit 51 as a delay control input. The digital data defines an absolute amount of the delay amount in the delay circuit 52. Thus, information for determining the delay amount in the delay circuit 52 (hereinafter, referred to as "delay control information") includes information for defining an absolute amount of the delay amount in the delay circuit 52.

Furthermore, the delay control information may include information for defining precision of the delay amount in the delay circuit 52.

Figure 20:
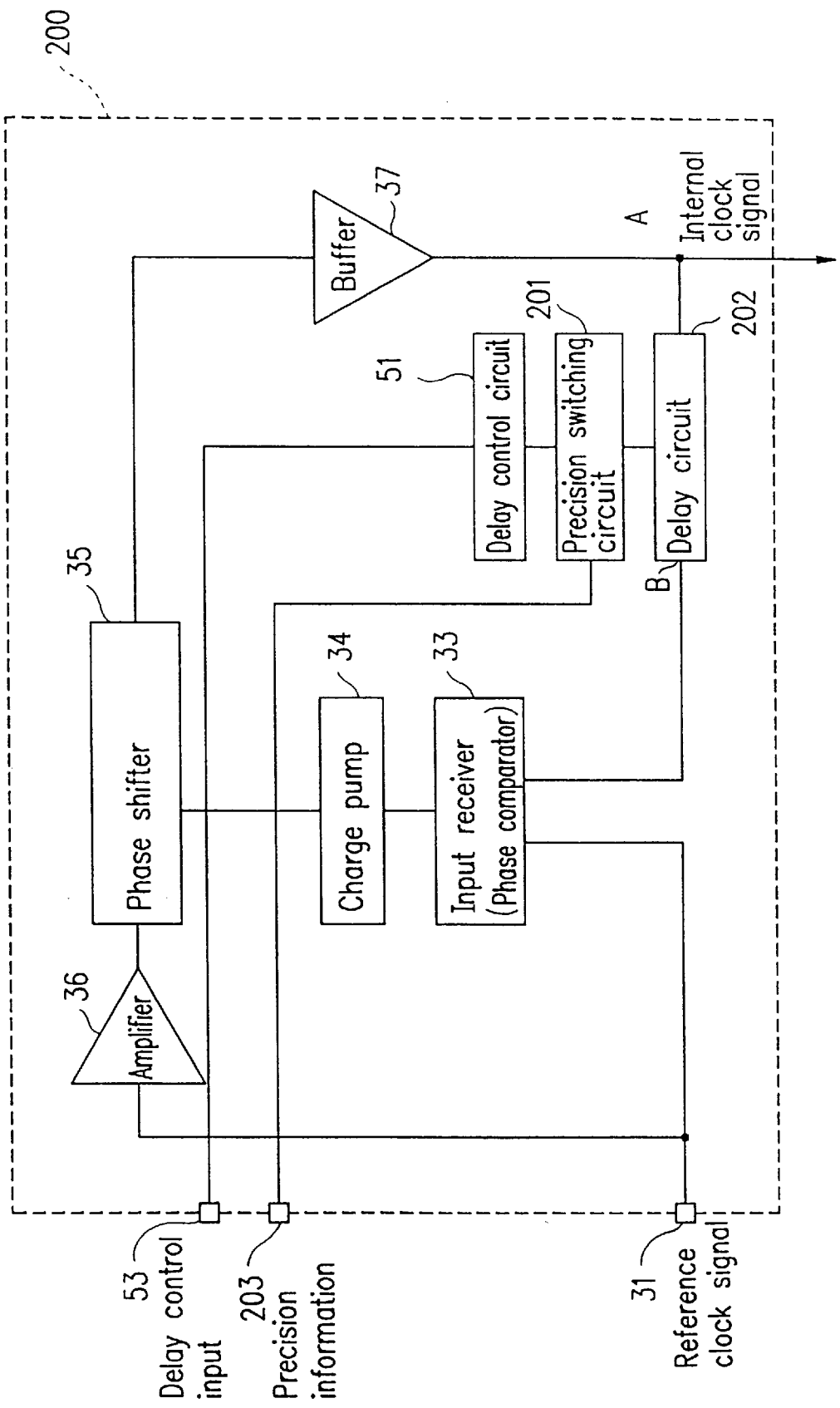
FIG. 20 is a combined block diagram and schematic diagram showing a phase adjusting circuit.

FIG. 20 shows a structure of a phase adjusting circuit 200. The phase adjusting circuit 200 is an alternative version of the phase adjusting circuit 45 shown in FIG. 5.

The phase adjusting circuit 200 is constructed by adding a precision switching circuit 201 to the structure of the phase adjusting circuit 45 shown in FIG. 5 and replacing the delay circuit 52 shown in FIG. 5 by a delay circuit 202 which is programmably variable in accordance with the precision of the delay amount. The phase adjusting circuit 200 includes a terminal 203. Information for defining the precision of the delay amount in the delay circuit 202 (hereinafter, referred to as "precision information") is input to the phase adjusting circuit 200 via the terminal 203. The precision switching circuit 201 receives the precision information which is input from the terminal 203 and determines the precision of delay amount to be set in the delay circuit 202 in accordance with the precision information. In the phase adjusting circuit 200, the same components as those of the phase adjusting circuit 45 shown in FIG. 5 bear the same reference numerals.

Alternatively, the terminal 53 can be used as the terminal 203 so that the precision information is input to the phase adjusting circuit 200 via the terminal 53.

Figure 21:
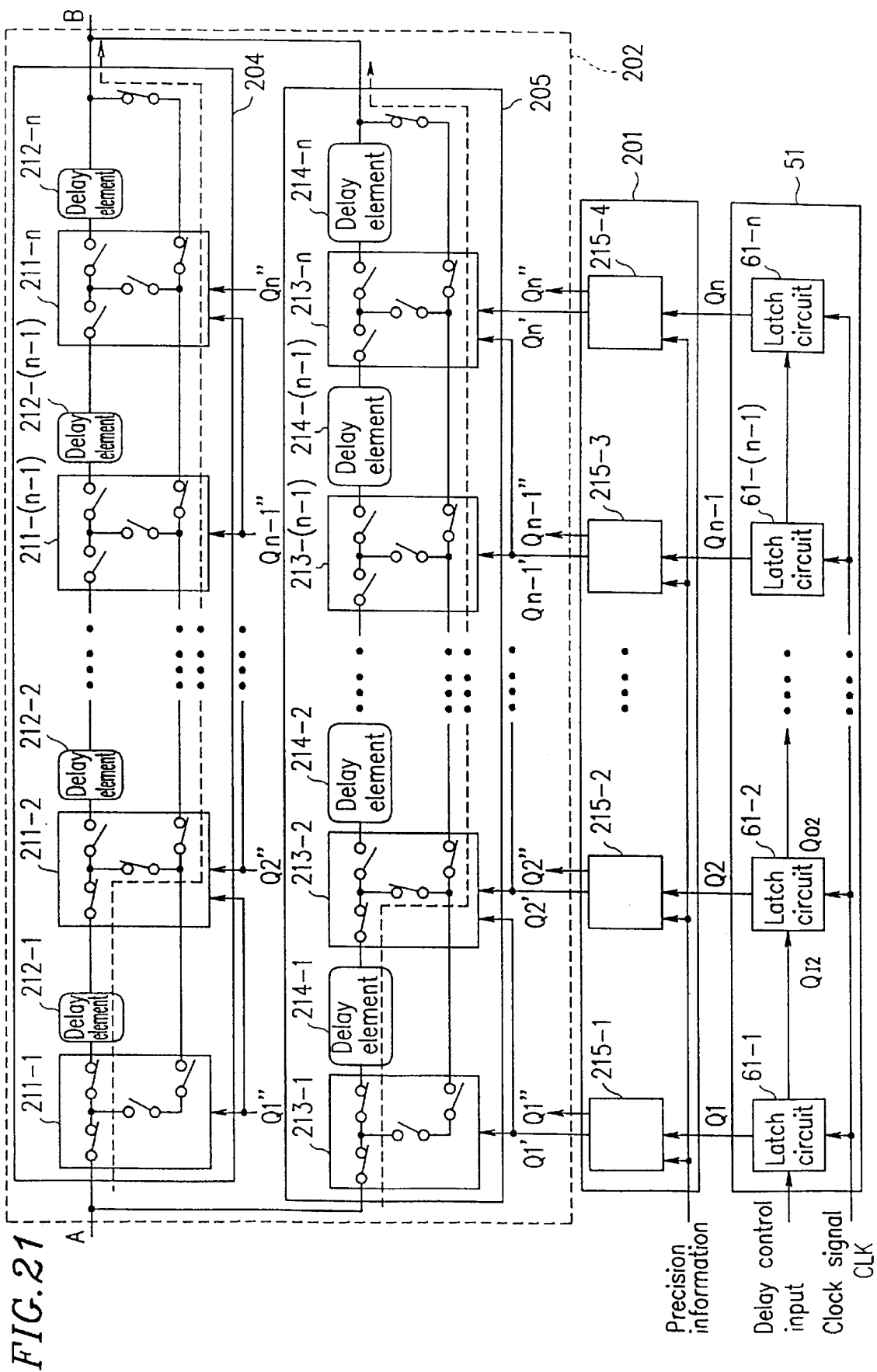
FIG. 21 is a schematic diagram showing a structure of a delay control circuit, a precision switching circuit and a delay circuit.

FIG. 21 shows a structure of the delay control circuit 51, the precision switching circuit 201 and the delay circuit 202.

The delay circuit 202 includes a delay circuit section 204 and a delay circuit section 205. Herein, the delay circuit 202 includes two delay circuit sections for the sake of simplifying the explanation. However, the delay circuit 202 can include an arbitrary number of delay circuit sections.

The structure of the delay circuit section 204 and the delay circuit section 205 is the same as that of the delay circuit 52 shown in FIG. 6A, except that the precision of delay elements 212-1 to 212-n included in the delay circuit section 204 are different from that of delay elements 214-1 to 214-n included in the delay circuit section 205. For example, the precision of the delay elements 212-1 to 212-n can be ⅛ of the precision of the delay elements 214-1 to 214-n. Needless to say, the relationship between the precision of the delay elements 212-1 to 212-n and the precision of the delay elements 214-1 to 214-n can be set to be an arbitrary relationship.

The precision switching circuit 201 supplies output signals Q1 to Qn from the latch circuits 61-1 to 61-n to either one of the delay circuit section 204 and the delay circuit section 205 in accordance with the precision information input from the terminal 203.

Thus, it is possible to control the delay amount in the delay circuit 202 in accordance with an absolute amount of the delay amount and the precision of the delay amount.

Next, referring to FIGS. 8 and 9, it will be described how to determine a predetermined delay time (delay amount) to be set in the delay circuit 52 in the phase adjusting circuit 45. This holds for the case of determining a delay time (delay amount) to be set in the delay circuit 32 in the phase adjusting circuit 24. This also holds for the case of determining a delay time (delay amount) to be set in the delay circuit 202 in the phase adjusting circuit 200.

Figure 8:
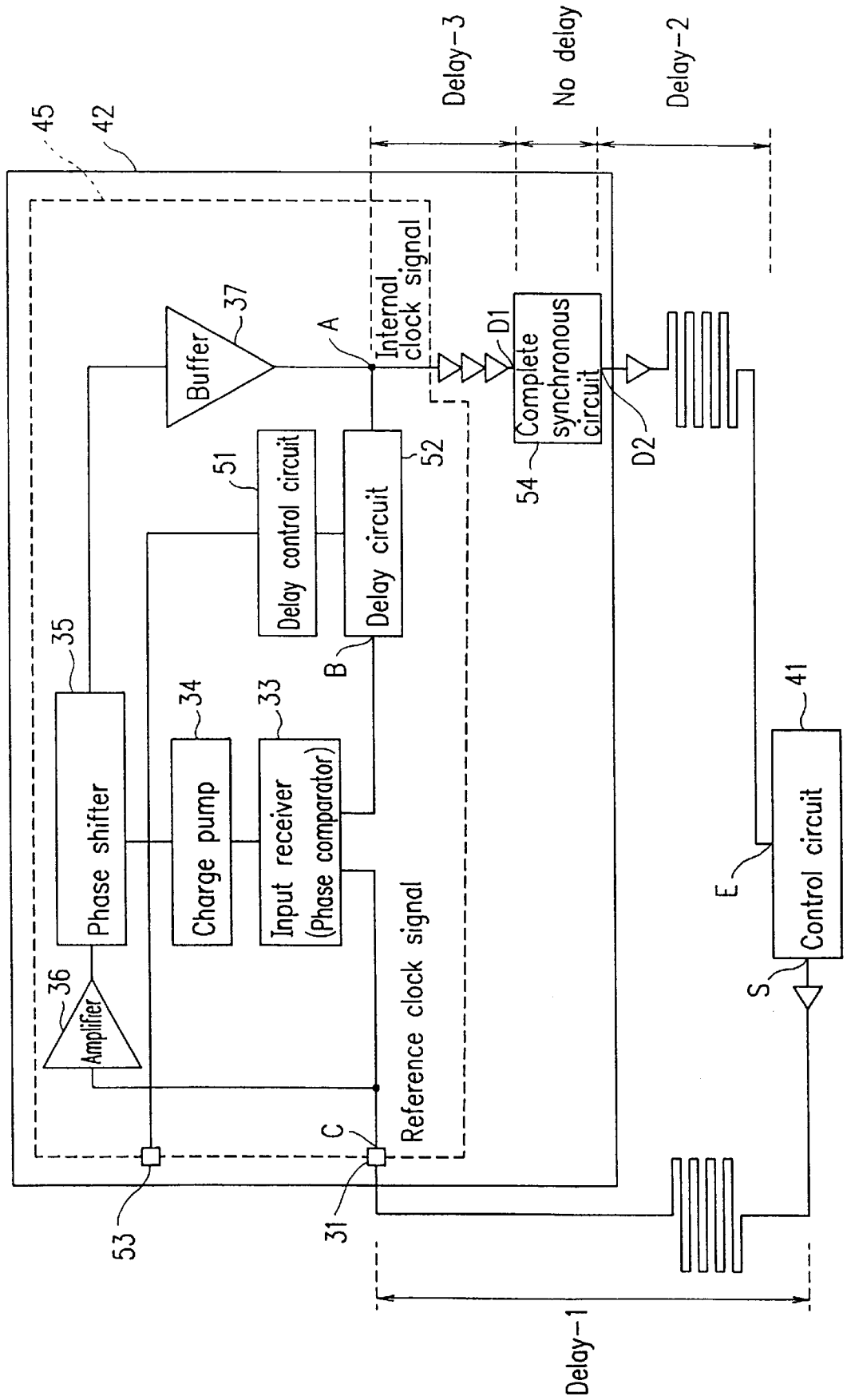
FIG. 8 is a schematic diagram sh owing delay to be considered in determining a predetermined delay time (delay amount) to be set in the delay circuit of FIG. 6A.

FIG. 8 shows delay to be considered (i.e., delay causing the shift of the phase between a reference clock signal and an internal clock signal) in determining a predetermined delay time (delay amount) to be set in the delay circuit 52. Three types of delay should be considered.

First, in the case where a reference clock signal is transmitted from an output terminal S of the control circuit 41 to an input terminal C (i.e., the terminal 31) of the semiconductor integrated circuit 42, delay is generated by a line extending from the output terminal S to the input terminal C (hereinafter, referred to as "delay-1").

Secondly, in the case where an output signal is transmitted from an output terminal D2 of the semiconductor integrated circuit 42 to an input terminal E of the control circuit 41, delay is generated by a line extending from the output terminal D2 to the input terminal E (hereinafter, referred to as "delay-2").

Thirdly, delay is generated by lines inside the semiconductor integrated circuit 42 (hereinafter, referred to as "delay-3"). Delay-3 will be described with reference to FIG. 9 below.

Figure 9:
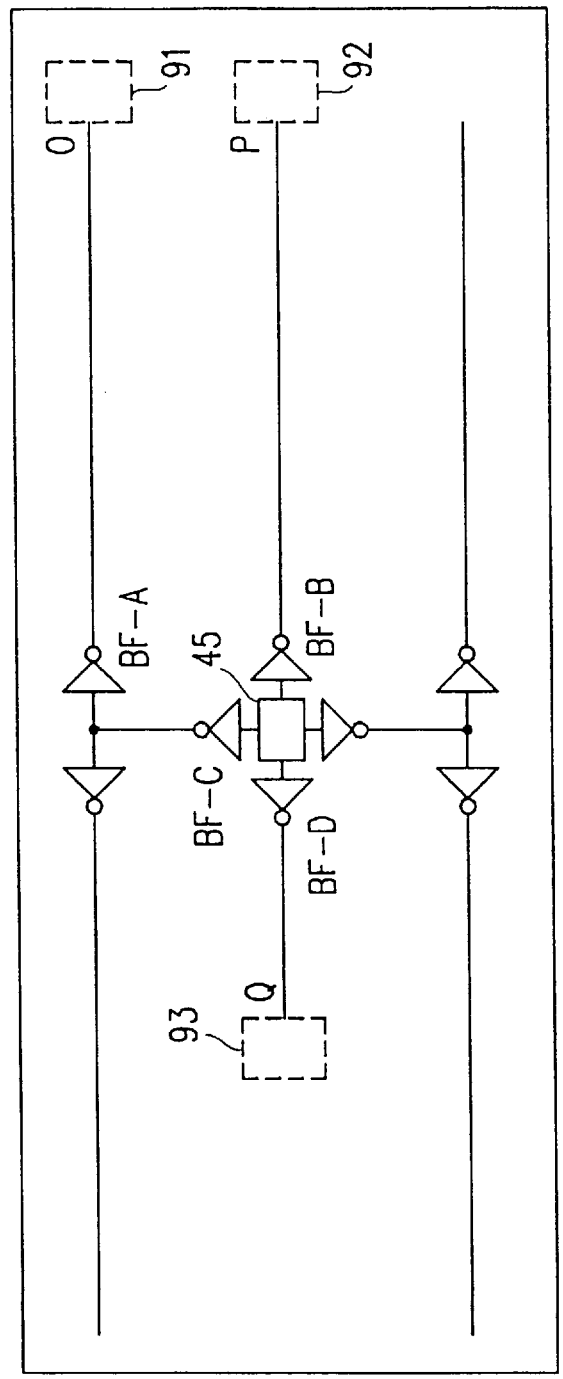
FIG. 9 is a block diagram showing an exemplary arrangement of a phase adjusting circuit and a plurality of blocks in a semiconductor integrated circuit.

FIG. 9 shows an exemplary arrangement of the phase adjusting circuit 45 and a plurality of blocks 91 to 93 in the semiconductor integrated circuit 42. The blocks 91 to 93 operate in synchronization with an internal clock signal output from the phase adjusting circuit 45. A branched clock signal O from the internal clock signal is supplied to the block 91. A branched clock signal P from the internal clock signal is supplied to the block 92. A branched clock signal Q from the internal clock signal is supplied to the block 93. In the explanation below, it is assumed that the phase of the branched clock signal O is the most delayed among the phases of the branched clock signals O, P and Q. In this case, the size of a buffer BF-B is reduced so as to allow the buffer BF-B to function as a delay circuit, so that the phase of the branched clock signal P can be delayed. In other words, the size of the buffer BF-B is reduced so that the phase of the branched clock signal P is matched with the phase of the branched clock signal O. Similarly, the size of a buffer BF-D is reduced so as to allow the buffer BF-D to function as a delay circuit, so that the phase of the branched clock signal Q can be delayed. In other words, the size of the buffer BF-D is reduced so that the phase of the branched clock signal Q is matched with the phase of the branched clock signal O. In this manner, a value of the buffer existing between the phase adjusting circuit 45 and each of the blocks 91 to 93 is previously adjusted so that delay time of the branched clock signals O, P and Q to the phase of the internal clock signal is uniform. Thus, delay-3 is adjusted so as to be uniform for each block in the semiconductor circuit 42.

By defining delay-3 as described above, although the delay time in the semiconductor integrated circuit 42 is increased, power consumption by the buffers existing between the phase adjusting circuit 45 and each of the blocks 91 to 93 can be reduced. This is because the phase of each branched clock signal is adjusted by reducing the size of the buffers. According to the present invention, as described later, it is possible to generate an internal clock signal having a phase which is ahead of the phase of the reference clock signal with taking delay-3 into consideration as well. Thus, no problems are caused by an increase in the delay time by matching the phase of the other branched clock signals with the phase of the most delayed branched clock signal. Rather, it is advantageous to eventually achieve low power consumption by matching the phase of the other branched clock signals with the phase of the most delayed branched clock signal.

Referring to FIG. 8 again, it is assumed that the phase shift between the point D1 and the point D2 can be ignored. This is because a complete synchronous circuit 54 is provided between the point D1 and the point D2 in the semiconductor integrated circuit 42. The complete synchronous circuit 54 is a digital circuit which operates in synchronization with an internal clock signal, such as a synchronous operation circuit.

It is ideal that the phase of a signal in a point S and the phase of a signal in a point E are matched and latency is as small as possible. However, a finite period of time necessary for a specific operation process and an access to a memory is required in a section between the point D1 to the point D2. Thus, it is necessary for the delay time not to affect latency as much as possible in sections other than the section between the point D1 to the point D2. The present invention has an objective of approaching the ideal by reducing the adverse effects of delay by delay-1, delay-2 and delay-3 based on the following principles.

FIG. 10 shows the relationship between a predetermined delay time (delay amount) to be set in the delay circuit 52 and a waveform of the internal clock signal at the point A.

A waveform (a) in FIG. 10 shows a reference clock signal in the input terminal C of the phase adjusting circuit 45. A waveform (b) in FIG. 10 shows an internal clock signal at the point A when assuming that the delay circuit 52 is not included. In the case where the delay circuit 52 is not included, the phase of the reference clock signal and the phase of the internal clock signal are completely matched by the function of the phase adjusting circuit 45.

A waveform (c) in FIG. 10 shows an internal clock signal at the point A when a predetermined delay time (delay amount) corresponding to delay-3 is programmed in the delay circuit 52.

A waveform (d) in FIG. 10 shows an internal clock signal at the point A when a predetermined delay time (delay amount) corresponding to (delay-3+delay-1) is programmed in the delay circuit 52.

A waveform (e) in FIG. 10 shows an internal clock signal at the point A when a predetermined delay time (delay amount) corresponding to (delay-3+delay-1+delay-2) is programmed in the delay circuit 52.

As described above, a delay amount necessary for adjusting the phase is programmed in the delay circuit 52 so that an edge of the internal clock signal at the point A, corresponding to a reference edge, rises at a time earlier than the time when the reference edge of the reference clock signal at the point C rises for the necessary delay amount. Herein, the reference edge of the reference clock signal at the point C is indicated by an arrow C in the waveform (a) in FIG. 10, and the edge of the internal clock signal at the point A is indicated by an arrow A in the waveforms (c), (d) and (e) in FIG. 10. A total delay amount or a delay amount in part is previously predicted and taken into consideration so that the edge of the internal clock signal at the point A can rise earlier as shown by the timing in the waveforms (c), (d) and (e) in FIG. 10.

Figure 11:
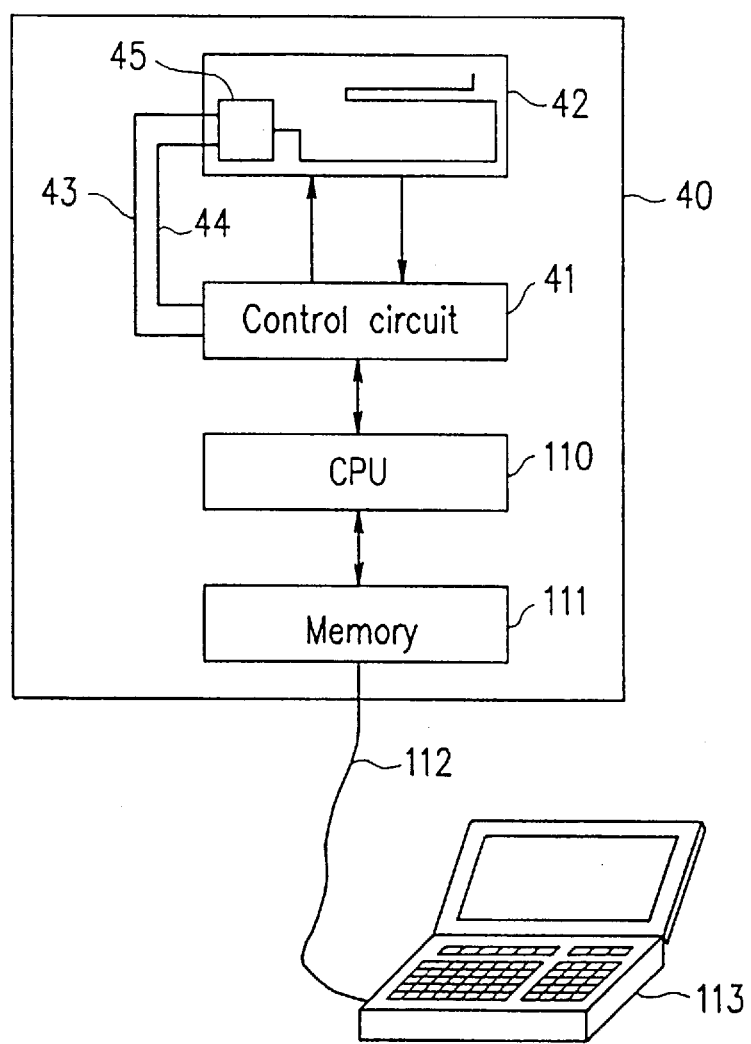
FIG. 11 is a combined block diagram and a perspective view showing an exemplary device structure required for setting a delay amount in the delay circuit in the phase adjusting circuit.

FIG. 11 shows an exemplary structure of a device needed for setting a delay amount in the delay circuit 52 in the phase adjusting circuit 45. The system 40 includes a CPU 110, and a memory 111 for storing a digital value corresponding to a delay amount. The memory 111 is connected to an external computer 113 via a cable 112. In the explanation below, it is assumed that the system 40 is implemented on one LSI board. The phase adjusting circuit 45 has the same structure as shown in FIG. 5, although the structure is not shown in FIG. 11.

Figure 12:
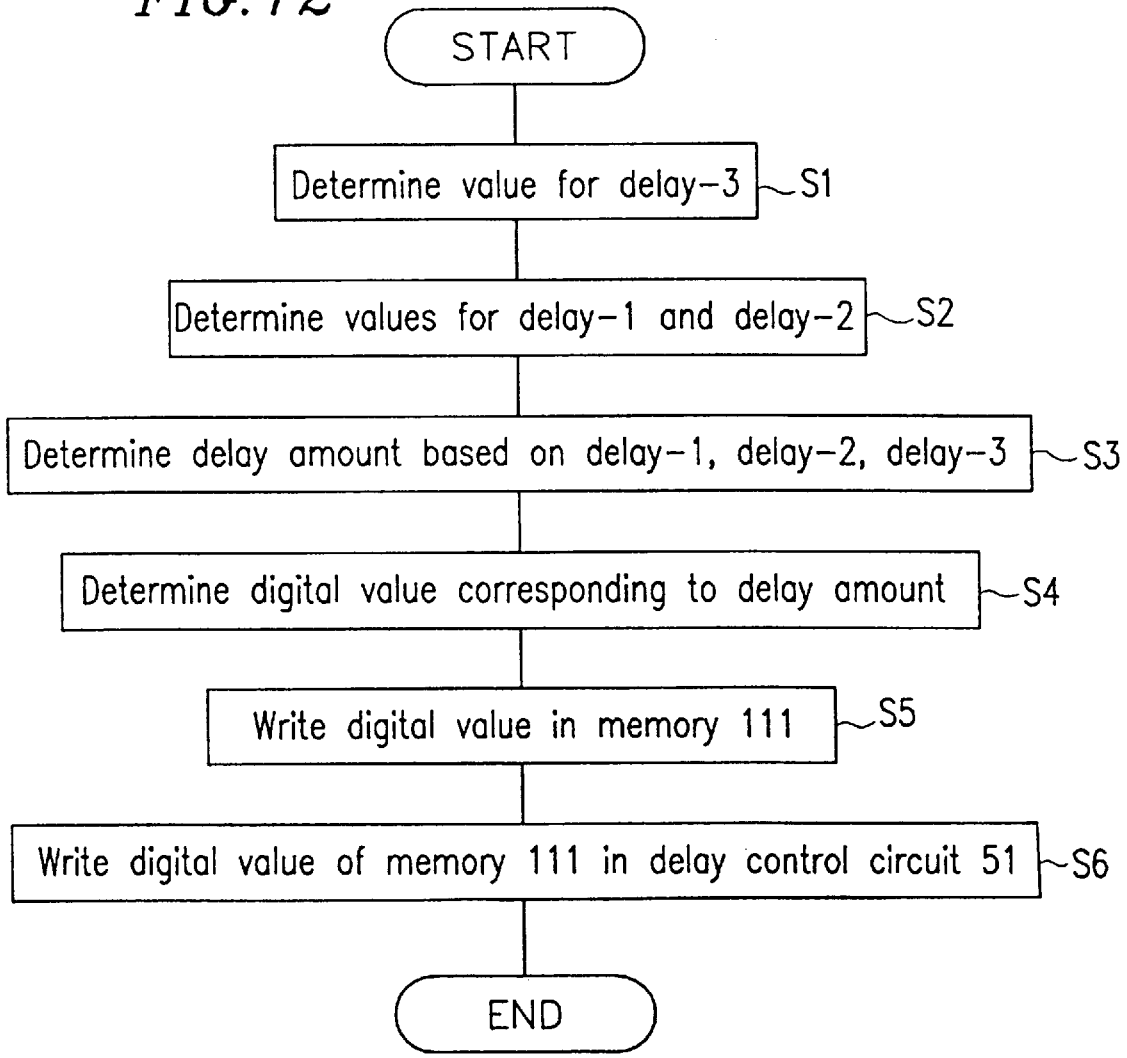
FIG. 12 is a flow chart showing a procedure for determining a delay amount to be set in the delay circuit and the phase adjusting circuit, and a procedure for programming the thus determined delay amount in the delay circuit.

FIG. 12 is a flow chart showing a procedure for determining a delay amount to be set in the delay circuit 52 in the phase adjusting circuit 45 and a procedure for programming the determined delay amount in the delay circuit 52.

First, at Step S1, an LSI vendor determines a value of delay-3 inside the semiconductor integrated circuit 42 based on a measured value or a simulation value. The LSI vendor makes public the value of delay-3 inside the semiconductor integrated circuit 42 as a specified value.

The values of delay-1 and delay-2 are determined after the semiconductor integrated circuit is implemented on the LSI board. At Step S2, a board designer determines values of delay-1 and delay-2 based on a measured value or a simulation value.

At Step S3, the board designer determines a delay amount to be written in the delay control circuit 51 of the phase adjusting circuit 45 based on the value of delay-3 provided by the LSI vendor and the values of delay-1 and delay-2 determined after the semiconductor integrated circuit is implemented on the board.

At Step S4, a digital value corresponding to a delay amount to be written in the delay control circuit 51 of the phase adjusting circuit 45 is determined. The digital value can be easily determined, as long as the structure of the delay circuit 52 of the phase adjusting circuit 45 is made public by the LSI vendor. An analog delay amount can be converted into the digital value by, for example, using the external computer 113.

At Step S5, the digital value determined at Step S4 is generated by the external computer 113, and the digital value is time-sequentially written in a memory which the CPU 110 on the LSI board can access. Herein, if the memory 111 is a non-volatile memory, such as a flash memory, it is unnecessary to write the digital value in the memory 111 again after the power of the LSI board is turned off. For this reason, the memory 111 is preferably a non-volatile memory such as a flash memory.

At Step S6, the CPU 110 reads out the digital value stored in the memory 111, and time-sequentially writes the read digital value in the delay control circuit 51 in the phase adjusting circuit 45 on the LSI board via the control circuit 41. Alternatively, the CPU 110 may time-sequentially write the read digital value directly in the delay control circuit 51 without passing through the control circuit 41. In the case where the semiconductor integrated circuit 42 includes a non-volatile memory therein, it is preferable that the CPU 110 writes the read digital value in the non-volatile memory included in the semiconductor integrated circuit 42. Once the digital value is written in the non-volatile memory included in the semiconductor integrated circuit 42, the necessity to write the digital value in the delay control circuit 51 every time power is turned on is eliminated. Thus, it is possible to simplify the control of writing the digital value to the delay control circuit 51 by allowing the semiconductor integrated circuit 42 to include the non-volatile memory for storing the digital value.

As described above, a delay amount to be set in the delay circuit 52 can be varied depending on the digital value written in the delay control circuit 51. Thus, depending on the wiring delay inside the semiconductor integrated circuit 42 and the location of the semiconductor integrated circuit 42 on the LSI board, it is possible to adjust the delay amount to be set in the delay circuit 52 after the semiconductor integrated circuit 42 is implemented on the LSI board. As a result, it is possible to operate the semiconductor integrated circuit 42 based on the optimal internal clock signal having an adjusted phase, no matter which place on the LSI board the semiconductor integrated circuit 42 is located. Thus, since the adjustment of the delay amount to be set in the delay circuit 52 can be performed after the implementation on the LSI board, it is possible to adjust the delay amount under various environments. In particular, in the case where a plurality of semiconductor integrated circuits are arranged on the LSI board, a delay amount for each of the plurality of semiconductor integrated circuits can be adjusted after their implementation on the LSI board, thereby enhancing the flexibility of the semiconductor integrated circuit. This results in reduction in cost of the semiconductor integrated circuits. Each of the semiconductor integrated circuits generally includes a phase adjusting circuit (PLL circuit) therein from the outset, and a layout area of the delay control circuit 51 and the delay circuit 52 is no more than 10% of the total area of the phase adjusting circuit (PLL circuit). Therefore, the penalty of the layout area to the entire chip is 1% or less, causing practically no problem in terms of cost.

Furthermore, since it is possible to adjust a delay amount to be set in the delay circuit 52 after the implementation of the LSI board, it is not necessary to enlarge the size of the driver transistor for driving the external lines of the LSI board, unlike the prior art. This reduces the power consumption of the entire system.

In Example 2, the delay control input is generated by the control circuit 41. Alternatively, the delay control input can be supplied from the outside of the control circuit 41 to the control circuit 41. For example, in the case where a specific application program is executed by the CPU 110, the CPU 110 can supply the delay control input to the control circuit 41. Such supply of the delay control input can be achieved, for example, by inserting an instruction including a value of the delay control input to the program to be executed by the CPU 110. The value of the delay control input can be programmed so as to change with time as the specific application program is executed.

The precision information can be supplied from the CPU 110 to the control circuit 41 as in the case of the delay control input. For example, in the case where the CPU 110 executes an instruction in which data is required to be transmitted and received at a higher transmission rate, the CPU 110 supplies precision information for selecting the delay circuit section having a higher precision among a plurality of delay circuit sections included in the delay circuit to the control circuit 41 before executing the instruction. Thus, the shift of the phase between the reference clock signal and the internal clock signal can be restricted with higher precision.

Furthermore, the CPU 110 may generate the delay control input based on location information of the semiconductor integrated circuit 42. The location information indicates which location in the system 40 the semiconductor integrated circuit 42 is located. The location information, for example, can be expressed by a set of X coordinates and Y coordinates. The location information, for example, can be previously stored in a predetermined position of the semiconductor integrated circuit 42. The CPU 110 reads the location information from the semiconductor integrated circuit 42 and converts the location information to a delay control input. Thus, without directly writing the value of the delay control input to the program, it is possible to supply the delay control input from the CPU 110 to the control circuit 41.

EXAMPLE 3

Figure 13:
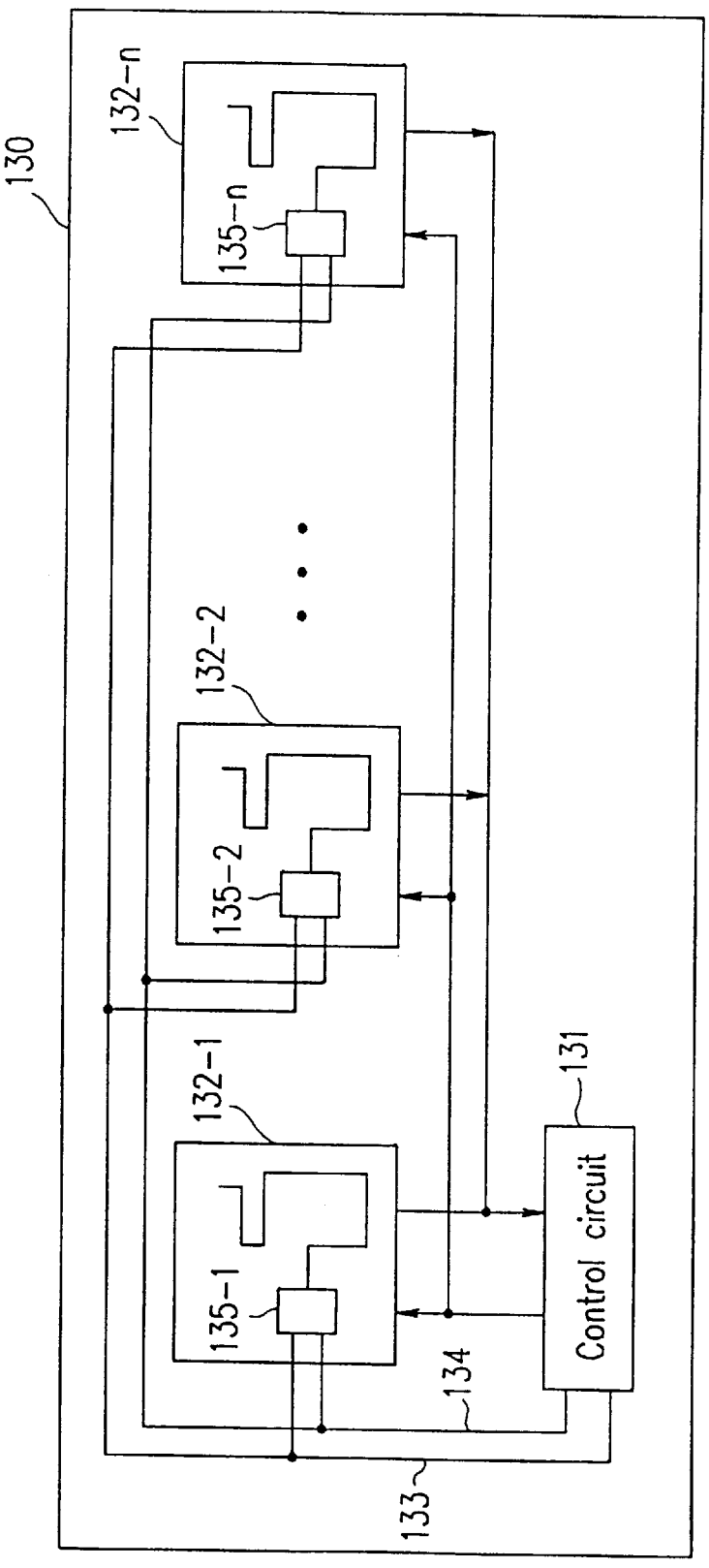
FIG. 13 is a block diagram showing a structure of a semiconductor integrated circuit of Example 3 according to the present invention.

FIG. 13 shows a structure of a system 130 of Example 3 according to the present invention. The system 130 includes a control circuit 131 for generating a reference clock signal and a plurality of semiconductor integrated circuits 132-1 to 132-n for operating in synchronization with the reference clock signal. Such a structure of the system 130 is suitable for the form of parallel processing for outputting a plurality of different data for a single instruction (single instruction multi data). For example, the control circuit 131 can be a processor, and the semiconductor integrated circuits 132-1 to 132-n can be memories. Alternatively, the control circuit 131 can be a master processor, and the semiconductor integrated circuits 132-1 to 132-n can be slave processors. The system 130 may be implemented on one chip.

The control circuit 131 and each of the semiconductor integrated circuits 132-1 to 132-n are connected by a line 133 and a delay control line 134. The control circuit 131 generates a reference clock signal and a delay control input. The reference clock signal generated by the control circuit 131 is supplied to each of the semiconductor integrated circuits 132-1 to 132-n via the line 133. The delay control input generated by the control circuit 131 is supplied to each of the semiconductor integrated circuits 132-1 to 132-n via the delay control line 134 common to the semiconductor integrated circuits 132-1 to 132-n. Each of the semiconductor integrated circuits 132-1 to 132-n operates in synchronization with the reference clock signal supplied from the control circuit 131 via the line 133. Data is input and output from the control circuit 131 to each of the semiconductor integrated circuits 132-1 to 132-n in synchronization with the reference clock signal. The semiconductor integrated circuits 132-1 to 132-n include phase adjusting circuits (PLL circuits) 135-1 to 135-n, respectively. The phase adjusting circuits 135-1 to 135-n have the same structure as the phase adjusting circuit 45 shown in FIG. 5. The delay control input is employed so that a delay time in each of the phase adjusting circuits 135-1 to 135-n can be programmably variable.

Figure 14:
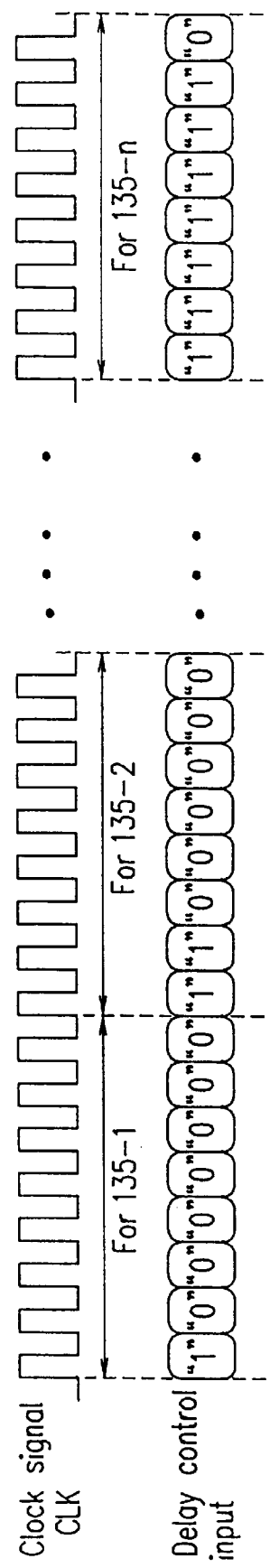
FIG. 14 is an exemplary digital data string supplied to the phase adjusting circuit.

For example, a digital data string shown in FIG. 14 is time-sequentially supplied as a delay control input to each of the phase adjusting circuits 135-1 to 135-n via the common delay control line 134. The digital data string is constituted by a digital value corresponding to a delay amount in the phase adjusting circuit 135-1, a digital value corresponding to a delay amount in the phase adjusting circuit 135-2, . . . , and a digital value corresponding to a delay amount in the phase adjusting circuit 135-n. In this example, each digital value is represented by 8 bits, but the number of bits may be arbitrary. The digital value depends on the circuit scale of the semiconductor integrated circuit including the phase adjusting circuit and the location of the semiconductor integrated circuits, and is determined in view of delay-1, delay-2 and delay-3 (see the procedure described referring to FIG. 12). For example, a digital value for the phase adjusting circuit 135-1 is "10000000", a digital value for the phase adjusting circuit 135-2 is "11000000", and a digital value for the phase adjusting circuit 135-n is "11111110".

As described above, the delay control line common to the phase adjusting circuits 135-1 to 135-n is provided and the digital data string is time-sequentially supplied to the phase adjusting circuits 135-1 to 135-n, so that there is no need to provide a delay control line having a bit width of the digital data string. As a result, the layout area of a chip can be reduced.

In the case where each of the semiconductor integrated circuits 132-1 to 132-n includes a non-volatile memory such as a flash memory therein, one writing of the digital value corresponding to the delay amount of the non-volatile memory suffices for each of the semiconductor integrated circuits 132-1 to 132-n after the implementation. In the case where each of the semiconductor integrated circuits 132-1 to 132-n does not include a non-volatile memory such as a flash memory therein, it is necessary to supply the digital value corresponding to the delay amount from the control circuit 131 to the respective delay control circuit inside the semiconductor integrated circuits 132-1 to 132-n, prior to the start of a stable operation of the system after power is turned on.

According to the present invention, the phase adjusting circuit 45 makes the phase of the internal clock signal be ahead of the phase of the reference clock signal for a predetermined delay time. However, this may produce a side effect that a setup time for input data is adversely reduced. This problem can be prevented by improving the following points.

Despite the phase adjustment by the phase adjusting circuit 45, the setup time for input data can be ensured in the following manners: (1) making a time lag between the timing of an input synchronous signal and the timing of an output synchronous signal in the semiconductor integrated circuit; and (2) making a time lag in timing at which the control circuit supplies a control signal to the semiconductor integrated circuit.

Hereinafter, referring to FIG. 15, the method for ensuring the setup time by making a time lag between the timing of an input synchronous signal and the timing of an output synchronous signal in the semiconductor integrated circuit will be described.

Figure 15:
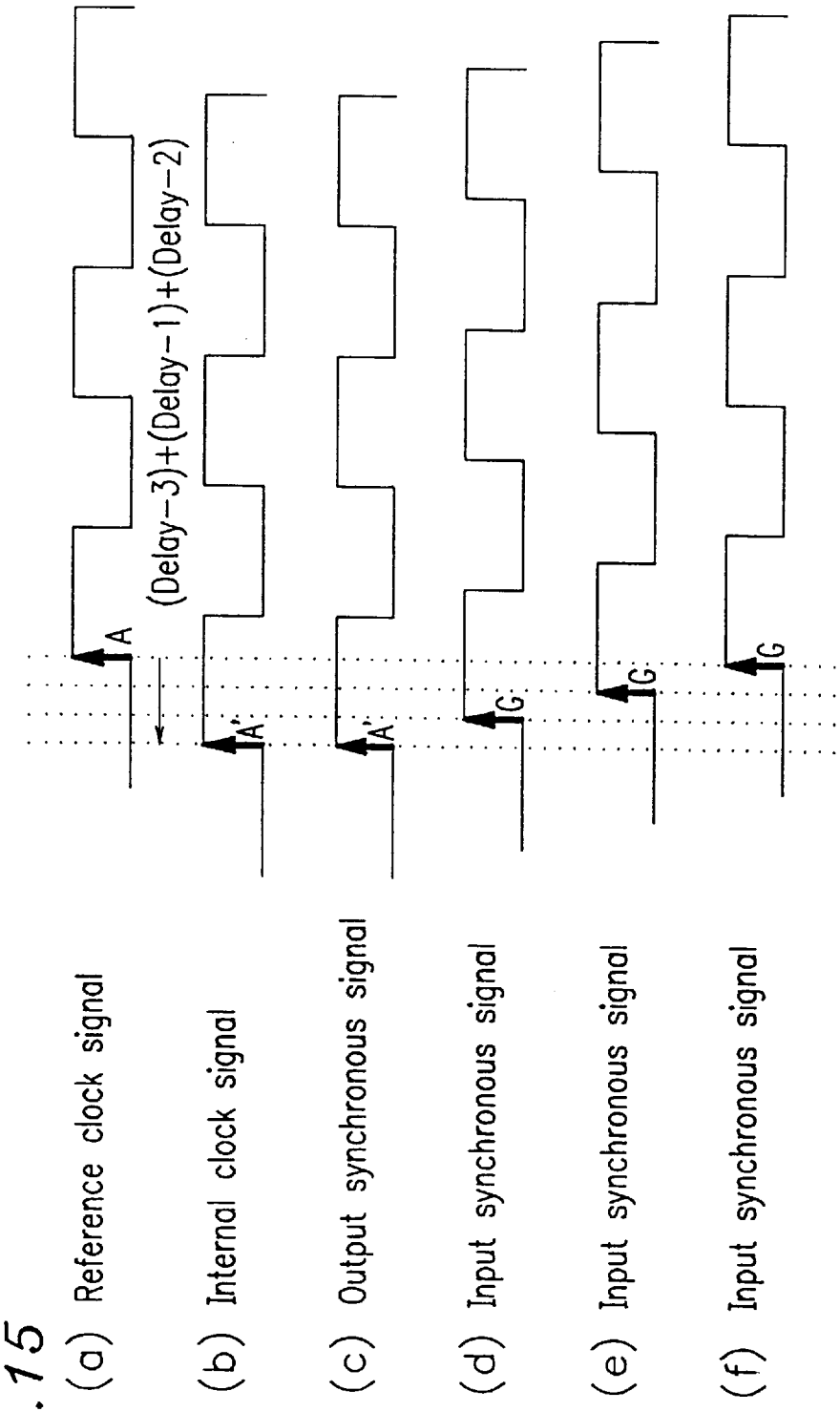
FIG. 15 is a timing diagram showing timing of an input synchronous signal and timing of an output synchronous signal in the semiconductor integrated circuit.

A waveform (a) in FIG. 15 shows a reference clock signal in an input terminal C of the phase adjusting circuit 45. A waveform (b) in FIG. 15 shows an internal clock signal at a point A when a delay amount corresponding to (delay-1+ delay-2+delay-3) is programmed in the delay circuit 52.

A waveform (c) in FIG. 15 shows an output synchronous signal. The "output synchronous signal" refers to a signal for defining timing at which the semiconductor integrated circuit 42 outputs data to the control circuit 41. The internal clock signal having the waveform (b) in FIG. 15 can be used as the output synchronous signal as it is. In the waveform (c), the edge of the output synchronous signal corresponding to the reference edge A of the reference clock signal is indicated by an arrow A'.

Input synchronous signals are shown by waveforms (d), (e) and (f) in FIG. 15. The "input synchronous signal" refers to a signal for defining timing at which the semiconductor integrated circuit 42 receives data from the control circuit 41. In the waveforms (d), (e) and (f), the edge of the input synchronous signal corresponding to the reference edge A of the reference clock signal is indicated by an arrow G. Thus, the input synchronous signals have the phases which are behind the phase of the internal clock signal shown in the waveform (b) in FIG. 15.

In order to obtain the input synchronous signal having the waveform (d), for example, the internal clock signal is taken from a tap point G1 (shown in FIG. 6A) of the delay circuit 52 and used as the input synchronous signal. In order to obtain the input synchronous signal having the waveform (e), for example, the internal clock signal is taken from a tap point G2 (shown in FIG. 6A) of the delay circuit 52 and used as the input synchronous signal. In order to obtain the input synchronous signal having the waveform (f), for example, the internal clock signal is taken from a point B (shown in FIG. 6A) and used as the input synchronous signal.

As described above, a phase difference between the output synchronous signal and the input synchronous signal is controlled so that the reduction in the setup time for input data can be prevented.

In the system requiring a higher speed in a reading cycle than a writing cycle, such as a graphic controller, a transition cycle in signal potential for the input can be reduced by making the phase of the internal clock signal ahead of the phase of the reference clock signal for a predetermined delay time. Therefore, since there is sufficient time for the setup of input data, even if the output synchronous signal has the same timing as the input synchronous signal, the above-mentioned problem does not arise. Instead, since the setup time for the output data is increased, higher performance can be obtained.

Figure 22:
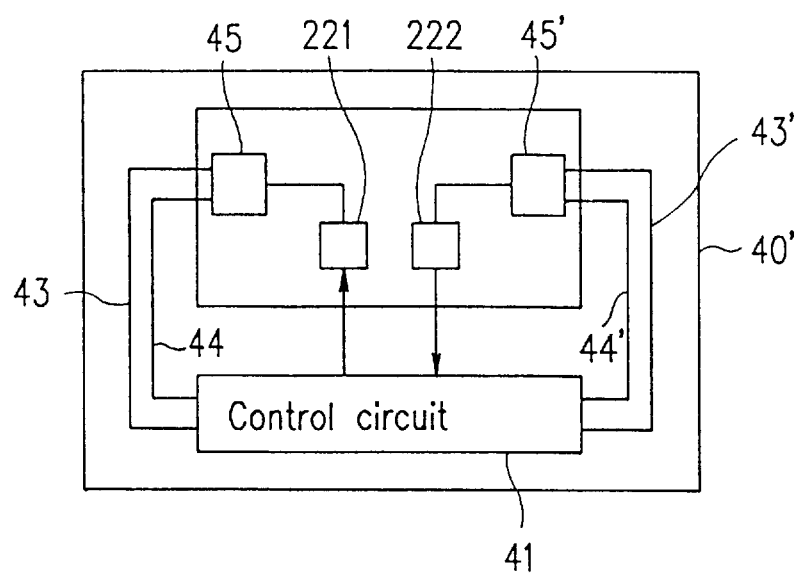
FIG. 22 is a block diagram showing a structure of a system.

Furthermore, in order to independently control the phase of the input synchronous signal and the phase of the output synchronous signal, as shown in FIG. 22, it is sufficient to add a phase adjusting circuit 45' to the structure of the system 40 shown in FIG. 4. The system 40' includes an input circuit 221 for receiving data from the control circuit 41 in response to the input synchronous signal and an output circuit 222 for outputting data to the control circuit 41 in response to the output synchronous signal. The input circuit 221 is controlled in synchronization with an internal clock (input synchronous signal) generated by the phase adjusting circuit 45, and the output circuit 222 is controlled in synchronization with an internal clock (output synchronous signal) generated by the phase adjusting circuit 45'.

The phase adjusting circuit 45' has the same structure as the phase adjusting circuit 45. The phase adjusting circuit 45' receives a reference clock from the control circuit 41 via the line 43'. The phase adjusting circuit 45' receives a delay control input from the control circuit 41 via the line 44'. The delay control input includes information regarding an absolute amount of the delay amount. Alternatively, the delay control input may include information regarding precision of the delay amount in addition to the information regarding the absolute amount of the delay amount. The line 43 and the line 43' may be a single line, and the delay control line 44 and the delay control line 44' may be a single delay control line.

According to the system 40' shown in FIG. 22, the delay amount in the phase adjusting circuit 45 and the delay amount in the phase adjusting circuit 45' can be independently set. This makes it possible to independently adjust the phase of the input synchronous signal and the phase of the output synchronous signal.

Furthermore, the delay control input may be supplied from the CPU 110 (not shown in FIG. 22) to the control circuit 41 in accordance with the execution of a specific application program. For example, in the case where an instruction requiring a large amount of data processing time is input to the semiconductor integrated circuit 42, before the instruction is input to the semiconductor integrated circuit 42, an instruction for making the phase of the input synchronous signal ahead for a predetermined time is supplied from the CPU 110 to the control circuit 41. The control circuit 41 sets a delay amount corresponding to the instruction in the phase adjusting circuit 45. Such a delay amount can be changed as the specific application program is executed. Thus, in accordance with the execution of the specific application program, the timing of data input and output between the control circuit 41 and the semiconductor integrated circuit 42 can be controlled.

Furthermore, at least one of a plurality of delay elements included in the phase adjusting circuit 45 may be used as a delay element of the phase adjusting circuit 45'. Conversely, at least one of a plurality of delay elements included in the phase adjusting circuit 45' may be used as a delay element of the phase adjusting circuit 45. For example, in the case where it is unnecessary to make the phase of the reference clock signal, the delay elements of the phase adjusting circuit 45' are not used to adjust the phase of the output synchronous signal. Such "extra" delay elements are used as a delay element of the phase adjusting circuit 45 so that it is possible to obtain the same effect with a smaller number of delay elements. The control circuit 41 supplies the delay control input to the phase adjusting circuit 45'. The delay control input includes information regarding the switching of the delay elements. For example, the semiconductor integrated circuit 42 connects at least one of the plurality of delay elements of the phase adjusting circuit 45' to the delay element of the phase adjusting circuit 45 in accordance with the information. Thus, the "extra" delay elements in a phase adjusting circuit can be used in another phase adjusting circuit.

Furthermore, a delay element having the smallest delay amount among the extra delay elements in a phase adjusting circuit may be selectively used in another phase adjusting circuit. Thus, it is possible to realize a phase adjusting circuit capable of setting a delay amount with higher precision with a smaller number of delay elements.

Hereinafter, referring to FIGS. 16 to 18, the method for ensuring the setup time for input data by making a time lag in timing at which the control circuit supplies a control signal to the semiconductor integrated circuit will be described.

Figure 16:
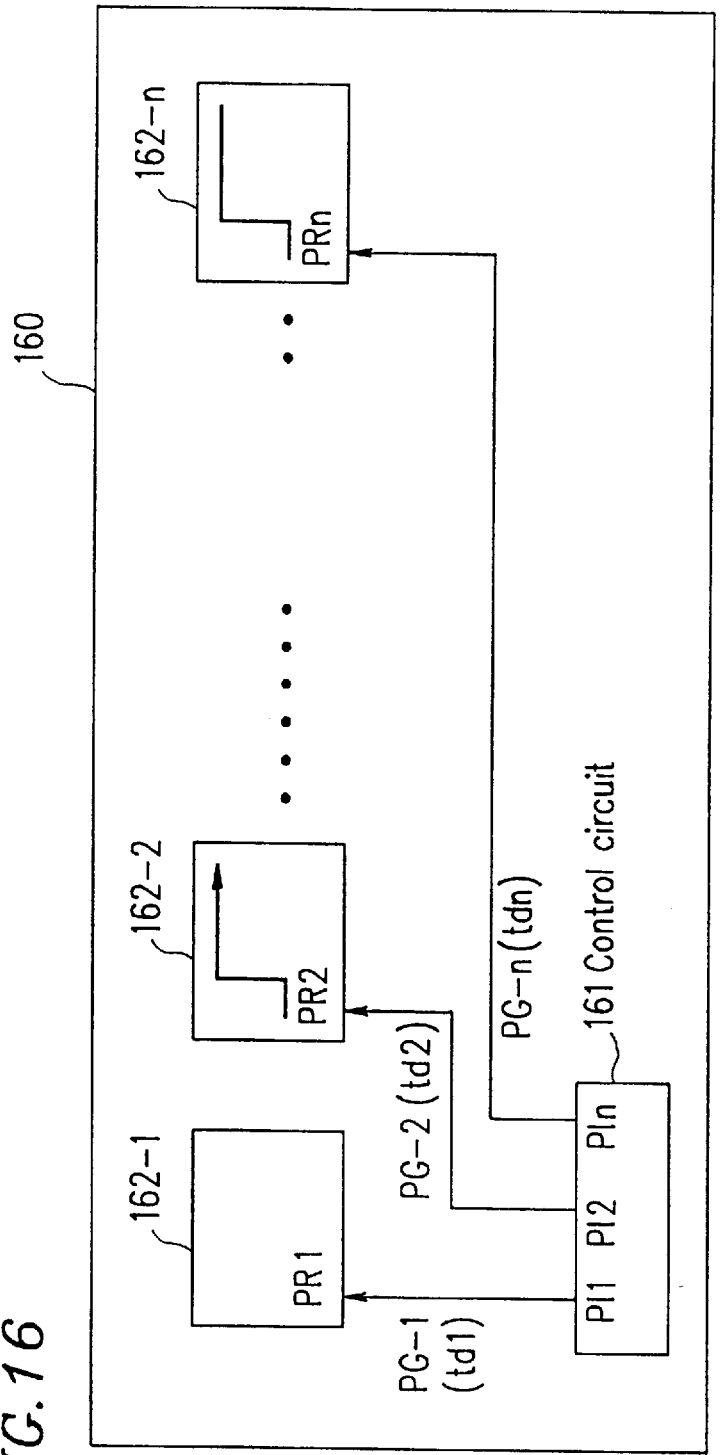
FIG. 16 is a block diagram showing a structure of a system.

FIG. 16 shows a structure of a system 160. The system 160 includes a control circuit 161 for generating a reference clock signal and a plurality of semiconductor integrated circuits 162-1 to 162-n which operate in synchronization with the reference clock signal. The system 160 may be implemented on one chip. The control circuit 161 supplies control signals PG-1 to PG-n to the respective semiconductor integrated circuits 162-1 to 162-n.

FIG. 17 shows waveforms of the control signals PG-1, PG-2 and PG-n supplied from points PI1, PI2 and PIn of the control circuit 161 in comparison with waveforms of conventional control signals. The control signal PG-1 is supplied from the point PI1 of the control circuit 161 to a point PR1 of the semiconductor integrated circuit 162-1. The control signal PG-1 is driven in synchronization with an internal clock signal PQ-1. A phase of the internal clock signal PG-1 is ahead of the phase of the reference clock signal for a delay time (td1) corresponding to delay due to lines between the point PI1 of the control circuit 161 and the point PR1 of the semiconductor integrated circuit 162-1. The control signal PG-2 is supplied from the point PI2 of the control circuit 161 to a point PR2 of the semiconductor integrated circuit 162-2. The control signal PG-2 is driven in synchronization with an internal clock signal PQ-2. A phase of the internal clock signal PQ-2 is ahead of the phase of the reference clock signal for a delay time (td2) corresponding to delay due to lines between the point PI2 of the control circuit 161 and the point PR2 of the semiconductor integrated circuit 162-2. The control signal PG-n is supplied from the point PIn of the control circuit 161 to a point PRn of the semiconductor integrated circuit 162-n. The control signal PG-n is driven in synchronization with an internal clock signal PQ-n. A phase of the internal clock signal PQ-n is ahead of the phase of the reference clock signal for a delay time (tdn) corresponding to delay due to lines between the point PIn of the control circuit 161 and the point PRn of the semiconductor integrated circuit 162-n.

Figure 18:
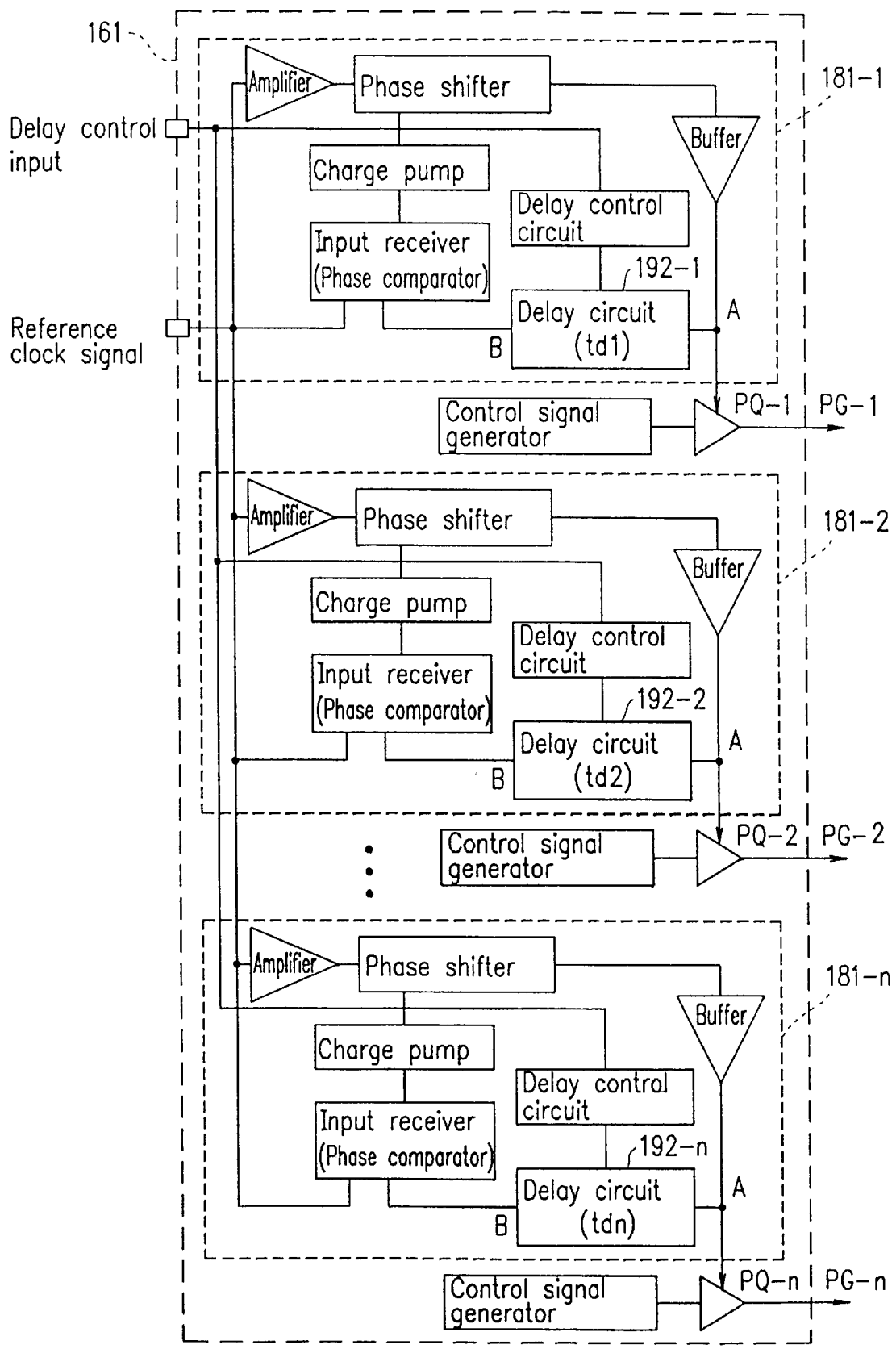
FIG. 18 is a combined block diagram and schematic diagram showing a structure of the control circuit of FIG. 17.
Figure 19:
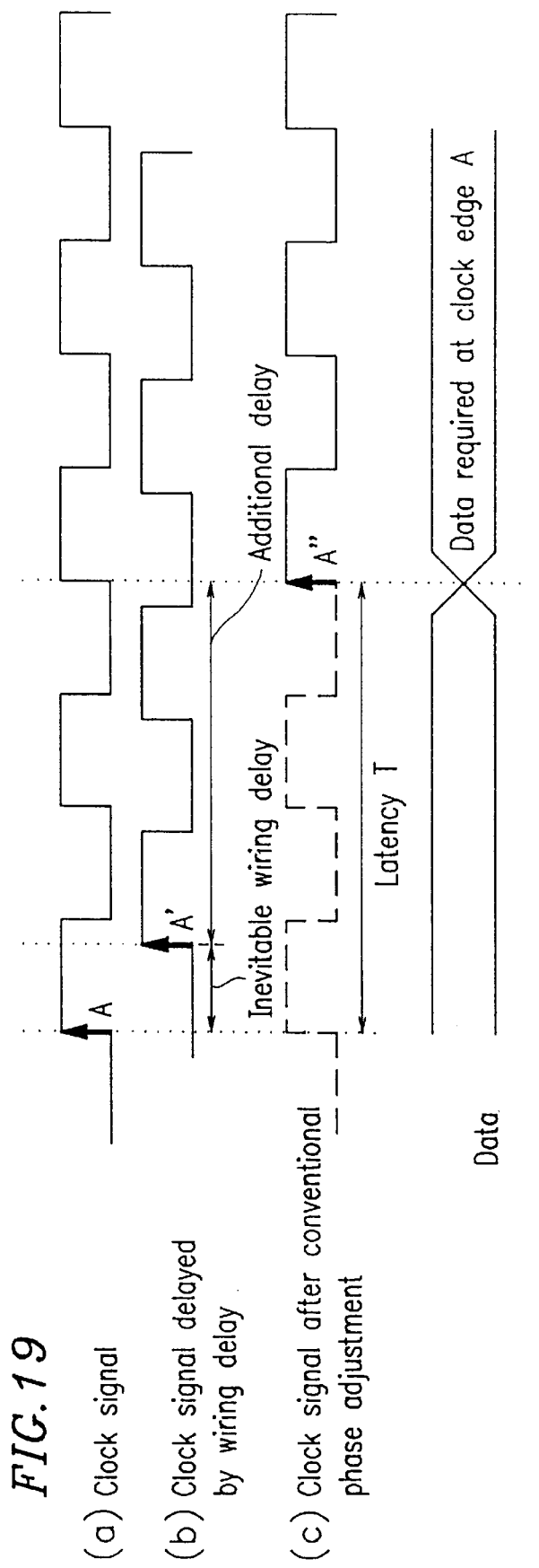
FIG. 19 is a prior art timing diagram showing the relationship between adjustment of a phase of a clock signal and data latency.

FIG. 18 shows a structure of the control circuit 161. The control circuit 161 includes a plurality of phase adjusting circuits 181-1 to 181-n. The phase adjusting circuits 181-1 to 181-n output the internal clock signals PQ-1 to PQ-n, respectively. The internal clock signals PQ-1 to PQ-n are employed so as to define the timing at which the control signal PG-1 to PG-n are supplied.

Each of the phase adjusting circuits 181-1 to 181-n has the same structure as the phase adjusting circuit 45. The phase adjusting circuits 181-1 to 181-n include delay circuits 192-1 to 192-n, respectively. A delay amount previously adjusted in view of the delay time (td1) to (tdn) due to the lines between the control circuit 161 and the semiconductor integrated circuits 161-1 to 161-n is set in each of the delay circuits 192-1 to 192-n.

A phase adjusting circuit is provided for each control signal in the control circuit 161 shown in FIG. 18. Alternatively, a plurality of control signals are grouped based on the delay amount so that a phase adjusting circuit for each group may be provided.

As described above, the control signals PG-1 to PG-n are driven in response to the internal signals PQ-1 to PQ-n so that the control signals PG-1 to PG-n can be driven earlier by the delay time corresponding to the delay due to the lines. Thus, the time when the control signals PG-1 to PG-n reach the semiconductor integrated circuits 162-1 to 162-n can be substantially uniform. Without making the time uniform, the internal clock signals output from the corresponding phase adjusting circuits inside the control circuits may be adjusted so that the control signals PG-1 to PG-n can reach the semiconductor integrated circuit located farther from the control circuit 161 at an earlier time.

It is expected that a margin is reduced as operation frequency is increased, or capacitance and resistance of common clock signal lines and bus lines are increased. The present invention has solved a problem of the delay of clock timing and transmission of signals, which otherwise is believed to be a more serious problem in the future due to the reduction of the margin.

According to the present invention, a delay amount can be adjusted for each semiconductor integrated circuit by programming even after the semiconductor integrated circuit is implemented. Thus, it is possible to generate an internal clock signal having a phase ahead of the phase of a reference clock signal. Furthermore, after the semiconductor integrated circuit is incorporated into an LSI as a module, it is possible to generate an internal clock signal having a phase ahead of the phase of a reference clock signal, by adjusting a delay amount for each semiconductor circuit by programming. This results in enhanced flexibility of each semiconductor integrated circuit and each module LSI.

According to the circuit of the present invention, even if a size of a buffer is reduced so as to match a phase of an internal clock signal with the phase of the block which is most behind, it is possible to make the phase of the internal clock signal ahead for a period corresponding to the delay amount by a phase adjusting circuit. This phase adjustment makes it possible to cancel the delay of the phase of the internal clock signal. As a result, power to be consumed in the buffer can be reduced, thereby obtaining a significant practical effect of low power consumption.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A system comprising a first circuit for providing a reference clock signal and delay control information and a second circuit for operating in synchronization with the reference clock signal, the second circuit including:
   a circuit for providing an internal clock signal in a phase relationship with the reference clock signal;
   a delay circuit for delaying the internal clock signal for a predetermined delay time;
   an adjusting section for adjusting a phase difference between a phase of the reference clock signal and a phase of the internal clock signal delayed for the predetermined delay time; and
   a delay control circuit for programmably changing the predetermined delay time in accordance with the delay control information,
   wherein the predetermined delay time is determined based on at least one of a first delay time generated by a line coupling the first circuit, the first circuit providing said reference clock signal to the second circuit, a second delay time generated by a line coupling the second circuit to the first circuit and a third delay time generated by a line which transfers the internal clock signal within the second circuit.

2. A system according to claim 1, wherein the delay control information includes precision information for defining precision of the predetermined delay time.

3. A system according to claim 1, wherein the delay control information is initially supplied from the outside of the system to the first circuit.

4. A system according to claim 1, wherein the delay control circuit includes a storage circuit for storing the delay control information, the delay circuit including a plurality of delay elements and a plurality of switching elements for controlling the number of delay elements to be serially connected among the plurality of delay elements, each of the plurality of switching elements being turned on or off in accordance with an output from the storage circuit.

5. A system according to claim 1, wherein the delay control information is a digital signal of a predetermined number of bits, the digital signal being time-sequentially supplied from the first circuit to the second circuit via a delay control line.

6. A system according to claim 1, wherein the second circuit includes a plurality of blocks for operating in synchronization with the internal clock signal, the internal clock signal being distributed to each of the plurality of blocks via a delay element, the third delay time being a delay time corresponding to the most delayed internal clock signal among the internal clock signals distributed to the plurality of blocks.

7. A system according to claim 1, wherein the second circuit generates an input synchronous signal, based on the internal clock signal, for defining timing at which the second circuit receives data from the first circuit, a phase of the input synchronous signal being ahead of the phase of the reference clock signal.

8. A system according to claim 1, wherein the second circuit receives first data from the first circuit, and the second circuit outputs second data to the first circuit, the second circuit includes:
   a circuit for generating an input synchronous signal for defining timing at which the second circuit receives the first data from the first circuit;
   a circuit for generating an output synchronous signal for defining timing at which the second circuit outputs the second data to the first circuit, and
   a phase of the input synchronous signal, and a phase of the output synchronous signal are independently controlled.

9. A system according to claim 1, wherein the system includes a plurality of second circuits for operating in synchronization with the reference clock signal, the delay control information being a digital signal of a predetermined number of bits, the digital signal being time-sequentially supplied from the first circuit to each of the plurality of second circuits via a delay control line common to the plurality of second circuits.

10. A system according to claim 1, wherein the system includes a plurality of second circuits for operating in synchronization with the reference clock signal,
   wherein the first circuit supplies a control signal to each of the plurality of second circuits, and
   the control signal has a phase which is ahead of the phase of the reference clock signal for a delay time corresponding to delay generated by a respective line between the first circuit and each of the plurality of second circuits.

11. A phase adjusting method comprising the steps of:

(a) determining a delay amount for an internal clock signal employed inside a second circuit for operating in synchronization with a reference clock signal generated by a first circuit, after the first circuit and the second circuit are implemented; and (b) adjusting a phase difference between a phase of the reference clock signal and a phase of the internal clock signal based on the delay amount, wherein the delay amount is determined based on at least one of a first delay time generated by a line coupling the first circuit, the first circuit providing said reference clock signal to the second circuit and a second delay time generated by a line coupling the second circuit to the first circuit.

12. A phase adjusting method according to claim 11, wherein the step (b) comprises the step of adjusting the phase difference so that a phase of the internal clock signal is ahead of a phase of the reference clock signal for a delay time corresponding to the delay amount.

13. A phase adjusting method according to claim 11, further comprising the step of changing the delay amount in accordance with delay control information.

14. A phase adjusting method according to claim 13, wherein the delay control information includes precision information for defining precision of the delay amount.

15. A phase adjusting method according to claim 11, wherein the second circuit generates an input synchronous signal, based on the internal clock signal, for defining timing at which the second circuit receives data from the first circuit, the phase adjusting method further comprising the step of adjusting a phase of the input synchronous signal so that the phase of the input synchronous signal is ahead of the phase of the reference clock signal.

16. A phase adjusting method according to claim 11, wherein the second circuit receives first data from the first circuit, and the second circuit outputs second data to the first circuit, the second circuit includes:

a circuit for generating an input synchronous signal for defining timing at which the second circuit receives the first data from the first circuit; and a circuit for generating an output synchronous signal for defining timing at which the second circuit outputs the second data to the first circuit, the phase adjusting method further comprising the step of independently controlling a phase of the input synchronous signal and a phase of the output synchronous signal.

17. A phase adjusting method according to claim 11, wherein a plurality of second circuits for operating in synchronization with the reference clock signal are implemented, and the first circuit supplies a control signal to each of the plurality of second circuits, the phase adjusting method further comprising the step of adjusting a phase of the control signal so as to be ahead of the phase of the reference clock signal for a delay time corresponding to delay generated by a respective line between the first circuit and each of the plurality of second circuits.

18. A phase adjusting method comprising the steps of:

(a) determining each delay amount for each of internal clock signals employed inside each of a plurality of second circuits for operating in synchronization with a reference clock signal generated by a first circuit, after the first circuit and the plurality of the second circuits are implemented; and (b) adjusting each phase difference between a phase of the reference clock signal and each phase of the internal clock signals based on the each delay amount, wherein the each delay amount is determined based on at least one of a first delay time generated by each line coupling the first circuit, the first circuit providing said reference clock signal to each of the plurality of the second circuits and a second delay time generated by each line coupling each of the plurality of the second circuits to the first circuit.

* * * * *